(12) United States Patent
Verhaverbeke et al.

(10) Patent No.: US 7,819,985 B2
(45) Date of Patent: Oct. 26, 2010

(54) METHOD AND APPARATUS FOR WAFER CLEANING

(75) Inventors: Steven Verhaverbeke, San Francisco, CA (US); J. Kelly Truman, Morgan Hill, CA (US); Alexander Ko, Sunnyvale, CA (US); Rick R. Endo, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 813 days.

(21) Appl. No.: 11/497,193

(22) Filed: Jul. 31, 2006

(65) Prior Publication Data

US 2006/0278253 A1    Dec. 14, 2006

Related U.S. Application Data

(60) Division of application No. 09/891,849, filed on Jun. 25, 2001, now Pat. No. 7,451,774, which is a continuation-in-part of application No. 09/603,792, filed on Jun. 26, 2000, now abandoned.

(51) Int. Cl.
*B08B 7/00* (2006.01)
*B08B 3/00* (2006.01)
*B08B 7/04* (2006.01)

(52) U.S. Cl. ............................. 134/33; 134/34; 134/36; 134/37; 134/30; 134/902

(58) Field of Classification Search .................... 134/1, 134/1.3, 18, 26, 28, 29, 30, 32, 33, 34, 36, 134/37, 184, 902
See application file for complete search history.

(56) References Cited

U.S. PATENT DOCUMENTS

| 3,182,671 A | 5/1965 | Vorie |
| 4,350,562 A | 9/1982 | Bonu |
| 4,401,131 A | 8/1983 | Lawson |
| 4,544,446 A | 10/1985 | Cady |
| 4,645,474 A | 2/1987 | Kubo et al. |
| 4,736,130 A | 4/1988 | Puskas |
| 4,804,007 A | 2/1989 | Bran |
| 4,979,994 A | 12/1990 | Dussault et al. |
| 5,108,512 A | 4/1992 | Goffnett et al. |

(Continued)

FOREIGN PATENT DOCUMENTS

EP       0 858 099       8/1998

(Continued)

OTHER PUBLICATIONS

"Powerful Solutions for Critical Cleaning". ProSys, Product Systems, Inc., 1p., 1998 http://www.prosysmeg.com/body_index.html.

(Continued)

*Primary Examiner*—Alexander Markoff
(74) *Attorney, Agent, or Firm*—Blakely Sokoloff Taylor & Zafman

(57) ABSTRACT

An apparatus for wet processing individual wafers comprising: a means for holding the wafer; a means for providing acoustic energy to a non-device side of the wafer; and a means for flowing a fluid onto a device side of the wafer.

16 Claims, 19 Drawing Sheets

U.S. PATENT DOCUMENTS

| | | | |
|---|---|---|---|
| 5,158,100 A | 10/1992 | Tanaka et al. | |
| 5,235,995 A | 8/1993 | Bergman et al. | |
| 5,379,785 A | 1/1995 | Ohmori et al. | |
| 5,518,542 A | 5/1996 | Matsukawa et al. | |
| 5,834,871 A | 11/1998 | Puskas | |
| 5,865,199 A | 2/1999 | Pedziwiatr et al. | |
| 5,909,741 A | 6/1999 | Ferrell | |
| 5,979,475 A | 11/1999 | Satoh et al. | |
| 5,984,391 A | 11/1999 | Vanderpot et al. | |
| 5,996,601 A | 12/1999 | Kern et al. | |
| 6,016,821 A | 1/2000 | Puskas | |
| 6,021,789 A | 2/2000 | Akatsu et al. | |
| 6,021,791 A | 2/2000 | Dryer et al. | |
| 6,036,785 A | 3/2000 | Ferrell | |
| 6,090,534 A | 7/2000 | Costigan et al. | |
| 6,115,867 A | 9/2000 | Nakashima et al. | |
| 6,143,081 A | 11/2000 | Shinriki et al. | |
| 6,181,052 B1 | 1/2001 | Puskas | |
| 6,276,370 B1 | 8/2001 | Fisch et al. | |
| 6,313,565 B1 | 11/2001 | Puskas | |
| 6,315,836 B1 | 11/2001 | Oka et al. | |
| 6,334,902 B1 | 1/2002 | Mertens et al. | |
| 6,370,791 B1 | 4/2002 | Weaver et al. | |
| 6,374,836 B1 | 4/2002 | Oroku | |
| 6,431,184 B1 | 8/2002 | Taniyama | |
| 6,435,200 B1 * | 8/2002 | Langen | 134/99.1 |
| 6,460,552 B1 | 10/2002 | Lorimer | |
| 6,505,634 B2 | 1/2003 | Son et al. | |
| 6,539,952 B2 | 4/2003 | Itzkowitz | |
| 6,595,224 B2 | 7/2003 | Miranda et al. | |
| 7,334,588 B2 | 2/2008 | Verhaverbeke et al. | |
| 2002/0029788 A1 | 3/2002 | Verhaverbeke et al. | |
| 2002/0157685 A1 | 10/2002 | Hayamizu | |
| 2008/0314424 A1 | 12/2008 | Verhaverbeke et al. | |
| 2009/0020144 A1 | 1/2009 | Verhaverbeke et al. | |

FOREIGN PATENT DOCUMENTS

| | | | |
|---|---|---|---|
| JP | H3-258381 | | 11/1991 |
| JP | H4-213826 | | 8/1992 |
| JP | 05013396 | A | 1/1993 |
| JP | 10163153 | A | 6/1998 |
| WO | WO 98 01896 | | 1/1998 |
| WO | WO 98/14985 | A1 | 4/1998 |
| WO | WO 00/21692 | A1 | 4/2000 |

OTHER PUBLICATIONS

"Ultrasonic Cleaning—Fundamental Theory and Application", PMR Systems, 2 pp. Jun. 5, 2000 http://www.pmrsystems.com/page10.html.

"Advanced Megasonic Cleaning". Vennerbeck, R., 9 pp., Jun. 5, 2000 http://www.pmrsystems.com/presentations/DVFPS98-Final/sId001.htm.

"Polymer Piezoelectric Transducers For Ultrasonic NDE". Bar-Cohen, et al., 8 pp., Sep. 1996, http://www.ndt.net/article/yosi/yosi.htm.

"Piezoelectric Transducers", 1 p., Feb. 20, 1998 http://www.bae.ncsu.edu/bae/research/bla...k/electrodes/projects/sensors/piezo.html.

"Comment on Particle Removal Mechanisms Via Megasonic Energy", Wu, et al., Verteq, Inc., Jun. 5, 2000; 3 pp., http://www.verteq.com/company/papers/VRTQ_MegMech1.htm.

"Typical Uses/Definition of Material Properties". Channel Industries, Jun. 5, 2000; 2 pp. http://www.sonatech.com/page04.htm.

"Piezoelectric Ceramic", Channel Industries-, Jun. 5, 2000, 3 pp. http://sonatech.com/page03.htm.

"What is the venturi affect?", Van Dien, Nature.Net; Dec. 13, 1999, 6 pp. http://www.nature.net/forums/load/weather/msg12161915959.html.

"What is the Boundary Layer as it Relates to Megasonic Cleaning?", ProSys, Jun. 5, 2000, 3.pp. http://www.prosysmeg.com/html/body_boundary-layer.html.

"Megasonic Cleaning System, Model 2000 SS", Jun. 5, 2000, 2 pp. http://www.seamboatsemi.com/equipment/megasonic.html.

"Megasonic Cleaning-What is megasonic cleaning?", Jun. 5, 2000, 3 pp. http://www.prosysmeg.com/html/body_megasonics.html.

"The Semiconductor Manufacturing Process: Wafer Lapping & Polishing". Fullman-Kinetics; Jun. 18, 2000, 2 pp.

"19th Annual Semiconductor Pure Water and Chemicals Conference", 2000 Proceedings Mar. 13-16, 2000, Santa Clara Convention Center, Santa Clara, CA—pp. 318-328, 13 pp.

International Search Report—PCT/US 01/20466—9 pages.

International Preliminary Examiner Report, PCT/US01/20466, 3 pages.

\* cited by examiner

Section A-A

METHOD AND APPARATUS FOR WAFER CLEANING

RELATED APPLICATIONS

The present divisional application is related to, incorporates by reference and hereby claims the priority benefit of the following U.S. Patent Applications, assigned to the assignee of the present applications: U.S. patent application Ser. No. 09/891,849, filed Jun. 25, 2001 now U.S. Pat. No. 7,451,744 which is continuation-in-part of U.S. patent application Ser. No. 09/603,792, filed Jun. 26, 2000 now abandoned.

BACKGROUND OF THE INVENTION

1. Field of the Invention

The present invention relates to the field of cleaning of a substrate surface and more particularly to the area of chemical and megasonic cleaning of a semiconductor wafer.

2. Discussion of Related Art

In semiconductor wafer substrate (wafer) cleaning, particle removal is essential. Particles can be removed by chemical means or by mechanical means. In current state of the art, particles are usually removed by both a combination of mechanical means and chemical means. The current state of the art is a batch process that places a number of wafers into a bath filled with a liquid and to apply high frequency (megasonic) irradiation to the liquid. Megasonic cleaning uses a ceramic piezoelectric crystal excited by a high-frequency AC voltage that causes the crystal to vibrate. The vibration causes sonic waves to travel through the liquid and provide the mechanical means to remove particles from the wafer surface. At the same time, chemicals in the liquid provide a slight surface etching and provide the right surface termination, such that once particles are dislodged from the surface by the combination of etch and mechanical action of the megasonics on the particles, these particles are not redeposited on the surface. In addition, chemicals are chosen such that an electrostatic repulsion exists between the surface termination of the wafer and the particles.

Until now, most megasonic irradiation has been applied to a bath in which the wafers are immersed. When using a cleaning bath filled with a liquid to immerse the wafer in, it is necessary to immerse multiple wafers at the same time to be efficient. Single wafer cleaning is possible in a bath, but then the chemicals have to be reused, because of the volume of a single wafer bath.

So far, mechanical agitation in a single wafer cleaning method has been achieved in several ways. At first, when wafers are completely flat, brushes can be used to scrub the wafer surface. However, this method is not possible when the wafers have any topography (patterns) that can be damaged by the brushes. Moreover, the brushes don't reach in between the wafer patterns. Megasonic energy, which is the preferred mechanical agitation when patterns are present, can be applied to a liquid in a nozzle and this liquid can then be sprayed on the wafer. When spray methods are used in this way, the sonic pressure waves are confined to the droplets of the spray where they then lose a lot of their power. When the droplets hit the wafer surface, most of the remaining sonic energy is lost. Another method used is to apply megasonic pressure waves with a quartz rod suspended over the wafer surface with the cleaning solution building up between the rod and the wafer surface.

None of these attempts to apply megasonics to a single wafer surface is sufficiently efficient as they do not reduce the single wafer cleaning time enough, which is of the utmost importance. A single wafer cleaning approach should be much faster than a batch cleaning process in order to be competitive. Moreover, none of the current single wafer techniques are able to clean sufficiently both the front and the backside of the wafer at the same time. The only known technique to clean the front and backside at the same time is to immerse a batch of wafers in a bath and apply the acoustic waves from the sides of the wafers. In this manner, the acoustic waves travel parallel to the wafer surfaces to be cleaned. In silicon wafer cleaning, it is important to clean both sides of the wafer even though only the device side (front side) contains active devices. Contamination left on the device side can cause a malfunctioning device. Contamination left on the non-device side (backside) can cause a number of problems. Backside contamination can cause the photolithography step on the front side to be out of focus. Contamination on the backside can cause contamination of the processing tools, which in turn can be transferred to the front side of the wafer. Finally, metallic contamination on the backside, when deposited before a high temperature operation, can diffuse through the silicon wafer and end up on the device side of the wafer causing a malfunctioning of the device.

Polysilicon or amorphous silicon is deposited on a silicon wafer for different purposes. It can be the gate material of the transistor, or it can be used for local interconnects or it can be used as one of the capacitor plates in a capacitor structure. Most commonly, polysilicon or amorphous silicon is deposited on an insulating material, such as silicon dioxide. Polysilicon or amorphous silicon is usually deposited by a CVD (chemical vapor deposition) technique. The deposition of polysilicon or amorphous silicon usually occurs unselectively, that is, the entire wafer is covered with a layer of polysilicon or amorphous silicon. After such a blanket deposition, the wafers are covered with photoresist, the photoresist is exposed with UV light according to a certain designed pattern, and developed. Then the polysilicon or amorphous silicon is etched in a plasma reactor. The exposure of the photoresist determines the pattern in which the polysilicon or amorphous silicon will be etched. Usually, the polysilicon is used to conduct current from one place to another place or to collect charge as in a capacitor. In both cases, the dimensions are scaled down with every new generation of technology.

Until recently, dimensions not smaller than 0.3 µm (micron) were being used. However, technologies using polyline dimensions smaller than 0.3 µm, such as 0.14 µm and even down to 0.1 µm are now being used. These poly-line dimensions and capacitor plate dimensions are so fragile a construction that they are prone to breakage. These constructs are so fragile that agitation may break them and cause a defective chip. After etching and photoresist removal, such as with an oxygen plasma (i.e. the ashing of the photoresist), the silicon wafers are usually riddled with particles. These particles have to be removed before going to the next device fabrication operation.

These particles are usually removed in a cleaning tool such as a wet bench. The particles are removed by immersing the wafers into a cleaning liquid and agitating the cleaning liquid with megasonic sound waves. This has worked well with poly-lines of 0.3 µm and above, however, when using poly-lines with dimensions smaller than 0.3 µm, megasonic sound agitation cannot be used as the megasonic sound agitation damages these fragile structures. Therefore, only chemicals can be used to clean particles when these fragile structures are exposed to the cleaning liquid. Although, even simple immersion into a cleaning liquid without agitation does remove some of the particles, it cannot remove all of the particles or even enough of the particles. Nevertheless, no alternative has existed and therefore, this is the only cleaning technique used on these fine structures.

SUMMARY OF THE INVENTION

A method and apparatus is disclosed for single wafer processing that applies a cleaning or rinse solution to one or both sides of a wafer positioned above a platter. The wafer can be positioned in a bracket, the bracket rotated, and the platter can apply megasonic energy in the form of one or more frequencies to a side of the wafer. The bracket can hold the wafer at three or more points where wafer position is maintained by gravity. At least one frequency applied to a 300 mm wafer can be at 5.4 MHz. The wafer side facing the platter may be the non-device side, and the platter can generate the megasonic energy at one or more frequencies with one or more acoustic wave transducers positioned on the platter backside.

The frequencies selected may be un-reflected by the platter and the wafer such that a large percentage of the megasonic energy will reach the wafer side not facing the platter. While a cleaning/rinse solution is applied to the wafer non-device side, a second cleaning/rinse solution may be applied to the wafer device side. The megasonic energy may be pulsed and/or applied at varying power.

According to the present invention, chemicals area applied requiring low volumes and no-reuse of the cleaning and rinse chemicals. Applying chemicals between the platter, having a dished out center, and the wafer, to be held in position by natural forces and then spinning the wafer to remove the chemicals is also disclosed.

DETAILED DESCRIPTION OF THE PRESENT INVENTION

Figure 1A:
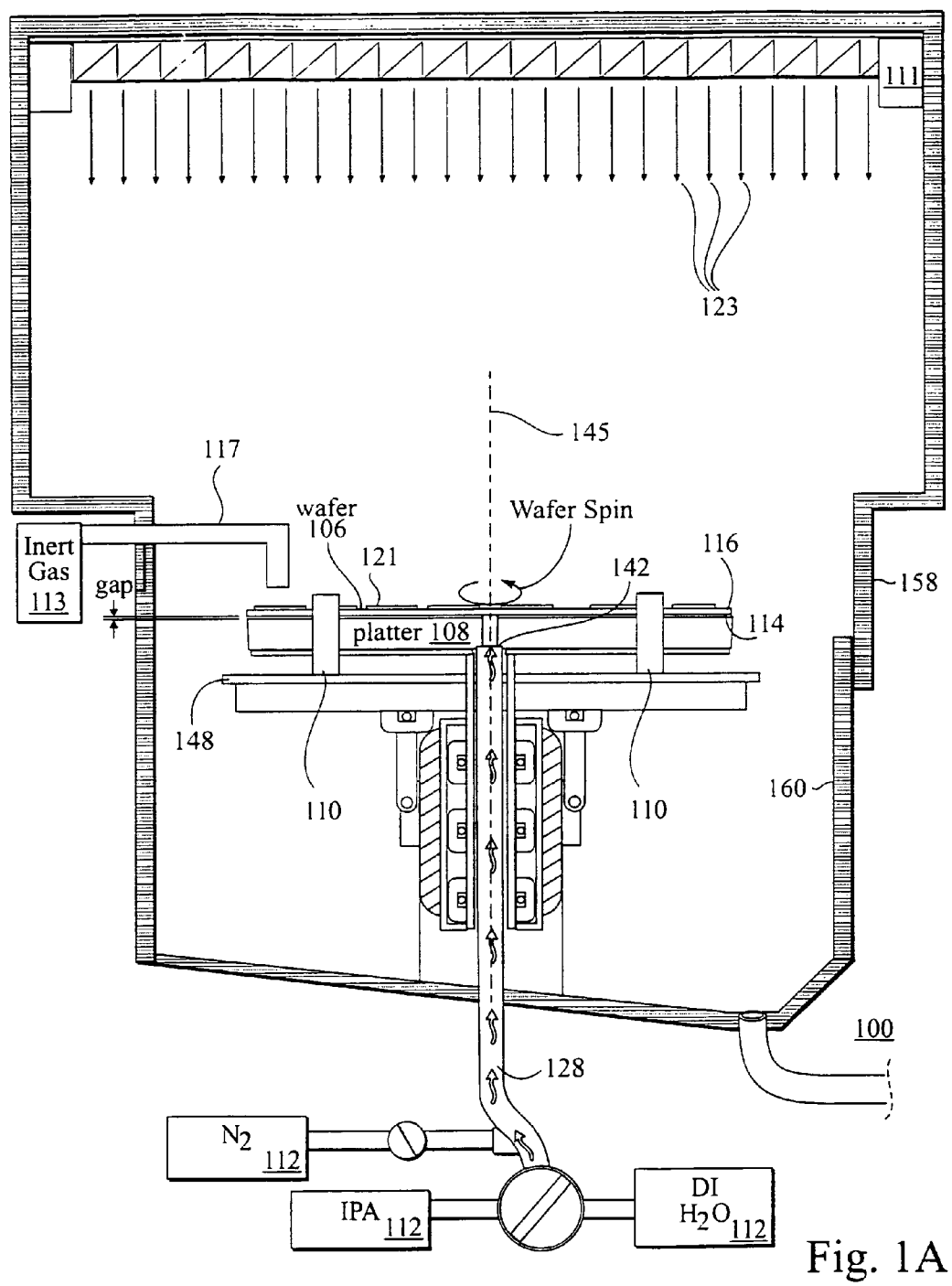
FIG. 1A is an illustration of one embodiment of a wafer cleaning chamber.

An apparatus and method of use to provide single wafer cleaning is disclosed. A process chamber (chamber) can process either or both a top and a bottom side of a single wafer in chip processing. The chamber can offer high wafer throughput along with good process control while providing low use of cleaning solutions.

In one embodiment, a single wafer is positioned in a wafer holding bracket (bracket) above a platter. Chemicals such as cleaning and rinse solutions are transferred through the platter from below to contact the bottom side of the wafer. Sufficient chemical flow is provided to fill a gap between the wafer and the platter. Once the gap is filled, little additional chemicals may be required, with the solution within the gap maintained in position by natural forces such as surface tension and capillary forces.

In another embodiment, a first group of chemicals (first chemical) are transferred to the bottom side of the wafer while chemicals from a different source (second chemical) are transferred to a top surface of the wafer. In either embodiment mentioned above, megasonic sound waves can be emitted from the platter to transfer through the first chemicals flowing from below and strike the wafer bottom surface. In yet another embodiment, which can include elements of the above embodiments, megasonic sound waves are placed within chemicals that are applied to the topside of the wafer where the solutions may be in the form of a spray or a thin film.

The use of acoustic wave transducers generating frequencies in the megasonic range has recently become common in wafer cleaning. The difference between ultrasonic cleaning and megasonic cleaning lies in the frequency that is used to generate the acoustic waves. Ultrasonic cleaning uses frequencies from approximately between 20-400 kHz and produces random cavitation. Megasonic cleaning uses higher frequencies beginning at between 350-400 kHz and may use frequencies well into the MHz range. An important distinction between the two methods is that the higher megasonic frequencies do not cause the violent cavitation effects found with ultrasonic frequencies. Megasonic significantly reduces or eliminates cavitation erosion and the likelihood of surface damage to the wafer. In general, the higher the frequency, the lower the damage to the wafer.

Megasonic cleaning produces more controlled cavitation. Cavitation, the formation and activity of bubbles, is believed to be an important mechanism in the actual particle removal process because cavitation has sufficient energy to overcome particle adhesion forces and cause particles to be removed. Controlled cavitation becomes acoustic streaming which can push the particles away so they do not reattach to the wafer. Megasonic cleaning may be improved by varying and/or pulsing the input power to the megasonic transducers, which can provide better control over cavitation than applying power continuously at a constant level. Megasonic cleaning may be improved through the use of a plurality of frequencies to be simultaneously generated, or by changing one or more frequencies during the clean and rinse the cycles, or a combination thereof. Megasonic cleaning may also be improved through a selection of the frequency or frequencies used.

In semiconductor processing, there are a number of occasions requiring processing of the wafer backside (non-device side) without processing the front side (device side), such as to remove backside particles before exposing the wafer to UV light from a lithography tool. Particles on the backside can cause depth-of-focus problems. In other occasions, deposition tools deposit materials on the front side on the wafers to form a film, but inadvertently, some deposits end up on the backside of the wafer. In other tools, such as copper electroplating tools, copper contamination can end up on the backside of the wafer. In all these cases, the backside has to be cleaned of particles and/or dissolved metals or certain layers have to be stripped.

FIG. 1A is an illustration of one embodiment of a single wafer cleaning chamber 100. Disclosed is an apparatus and method of use for exposing the bottom side of the wafer 106 to cleaning, rinsing and drying chemicals 112 without exposing the topside of the wafer 106 to any chemicals. In one embodiment, the wafer non-device side 114 is facing down to be exposed to chemicals 112, while the wafer device side 116 is facing up and is not exposed to chemicals 112.

In one embodiment, to initiate a wafer process cycle, a rotatable wafer holding bracket (bracket) 148 translates along an axis 145 a distance upward. A robot arm (not shown) holding the wafer 106 enters the interior of the chamber 160 through an access door 158 and the wafer 106 is placed in the bracket 148. The bracket 148 is then lowered so as to align the wafer 106 horizontally a distance from a circular platter 108. The wafer 106, resting in the bracket 148, is parallel to the platter 108 and located a distance from the platter 108, i.e. the gap. The platter 108 is flat where it faces the wafer 106 and therefore, the distance separating the platter 108 and the wafer 106 is uniform. The gap between the wafer 106 and the platter 108 may be in the range of approximately 1-5 millimeters (mm) and preferably approximately 3 mm.

In one embodiment, the wafer 106 when positioned in the bracket 148 can rest on three or more vertical support posts (posts) 110 of the bracket 148. The vertical support posts 110 can contain an elastomer pad (shown in FIG. 4A later) to contact the wafer 106 directly. The wafer 106 is rotated while chemicals 112 are dispensed from below to contact the wafer backside 114. A tube 128 connects to a through hole (feed port) 142 in the platter 108. As a result of wafer 106 rotation (spin), chemicals 112 applied to the wafer backside 114 are restricted from reaching devices 121 on the wafer front side 116. In addition, a nozzle 117 may move in over the wafer 106 o be positioned within approximately 5 mm of the wafer surface and in the outer half of the wafer radius. The nozzle 117 can apply a stream of inert gas 113 such as $N_2$ to the wafer device side 116 to further limit chemicals 112 applied to the wafer backside 114 from migrating onto the wafer front side 116. Gravity and the downward flow of air 123 from a filter 111 such as a High Efficiency Particulate Arresting (HEPA) filter or an Ultra Low Penetration Air (ULPA) filter can act to maintain the wafer 106 positioned on the posts 110. Chemicals 112 placed between the wafer 106 and the platter 108 can be maintained in position by natural forces such as capillary action and surface tension. As a result, a chemical flow rate required to maintain the chemicals 112 against the wafer backside 114 can be reduced during processing, which can allow for a small chemical use in each cycle and can also allow for an efficient "no reuse" of chemicals 112. During the cleaning portion of the process, the wafer rotation may be stopped allowing the wafer 106 to remain still while the cleaning chemicals 112 contact the wafer bottom surface 114. The wafer 106 can be rotated, however, to wet out the wafer bottom surface 114 initially with the cleaning chemicals as well as for the rinse and dry cycles.

Figure 1B:
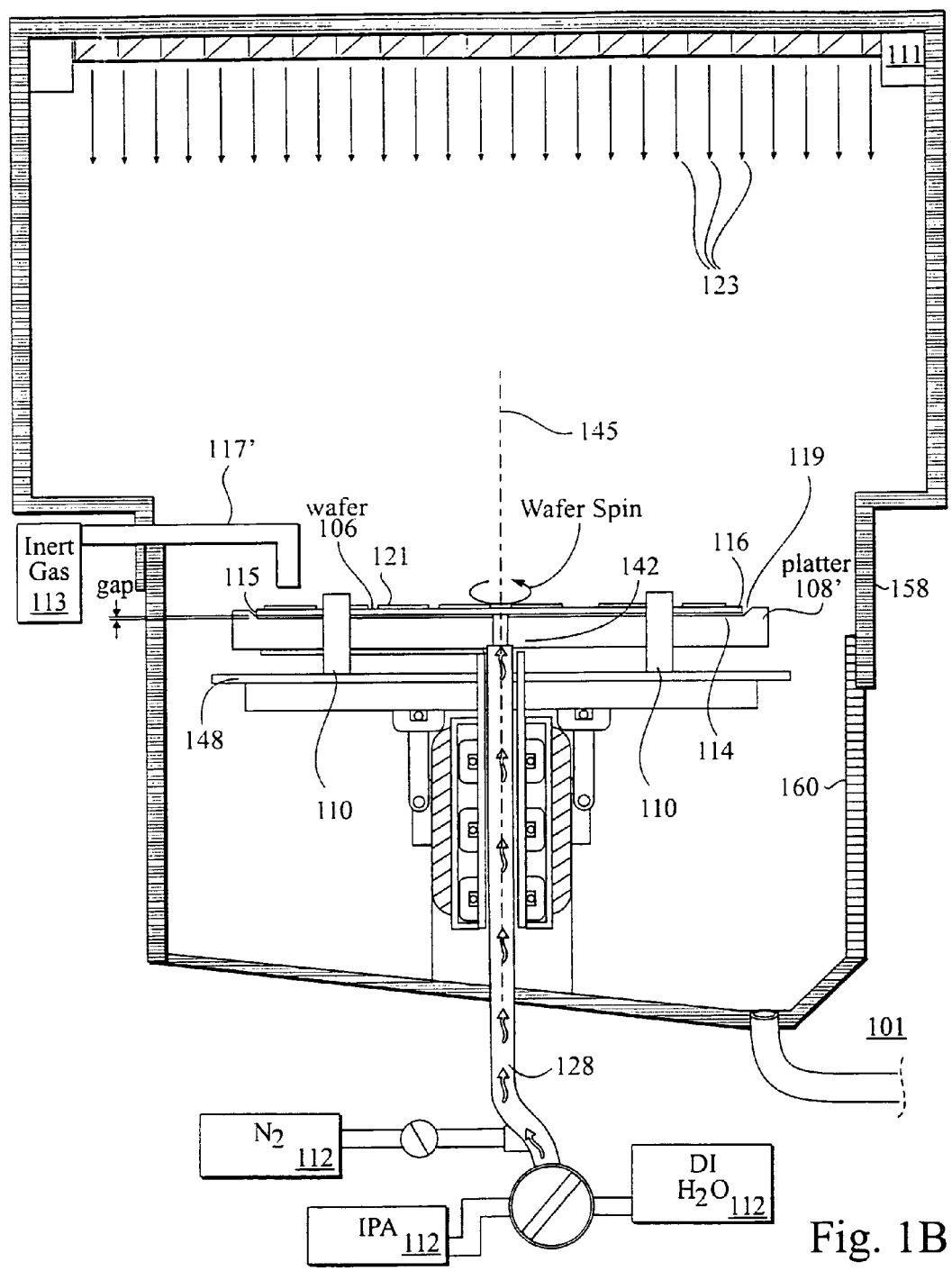
FIG. 1B is an illustration of an alternate embodiment of the wafer cleaning chamber.

FIG. 1 B is an illustration of an alternate embodiment of a single wafer cleaning chamber 101. In this embodiment, the platter 108' has a dished-out center area 119 on the platter side facing the wafer 106. For processing, chemicals 112 can be placed in the dished-out area 119 and the wafer 106 can be positioned within the dished-out area 119 such that the wafer backside 114 is contacting the chemicals 112. This dished-out area 119 of the platter 108' can function to contain the chemicals 112 and further reduce the amount of chemicals 112 needed during a process cycle. The dished out center 119 can be deep enough to submerge the bottom surface 114 of the wafer 106 while the top surface 116 of the wafer 106 remains outside of the chemicals 112. In one embodiment, approximately one half of the total surface area of the wafer 106 is submerged within the chemicals 112. A nozzle 117' may be placed in the top area of the chamber 160 to flow a gas such as nitrogen onto the wafer topside. The nozzle 117" may have to move or pivot to avoid contact with the wafer 106 during wafer placement and removal as well as for the rinse and spin cycles. The gas flow from the nozzle 117' along with centrifugal forces if the wafer is spinning, can shift the chemicals 112 toward the wafer edge 115, further limiting migration of any chemicals 112 onto the wafer top surface 116.

Figure 2A:
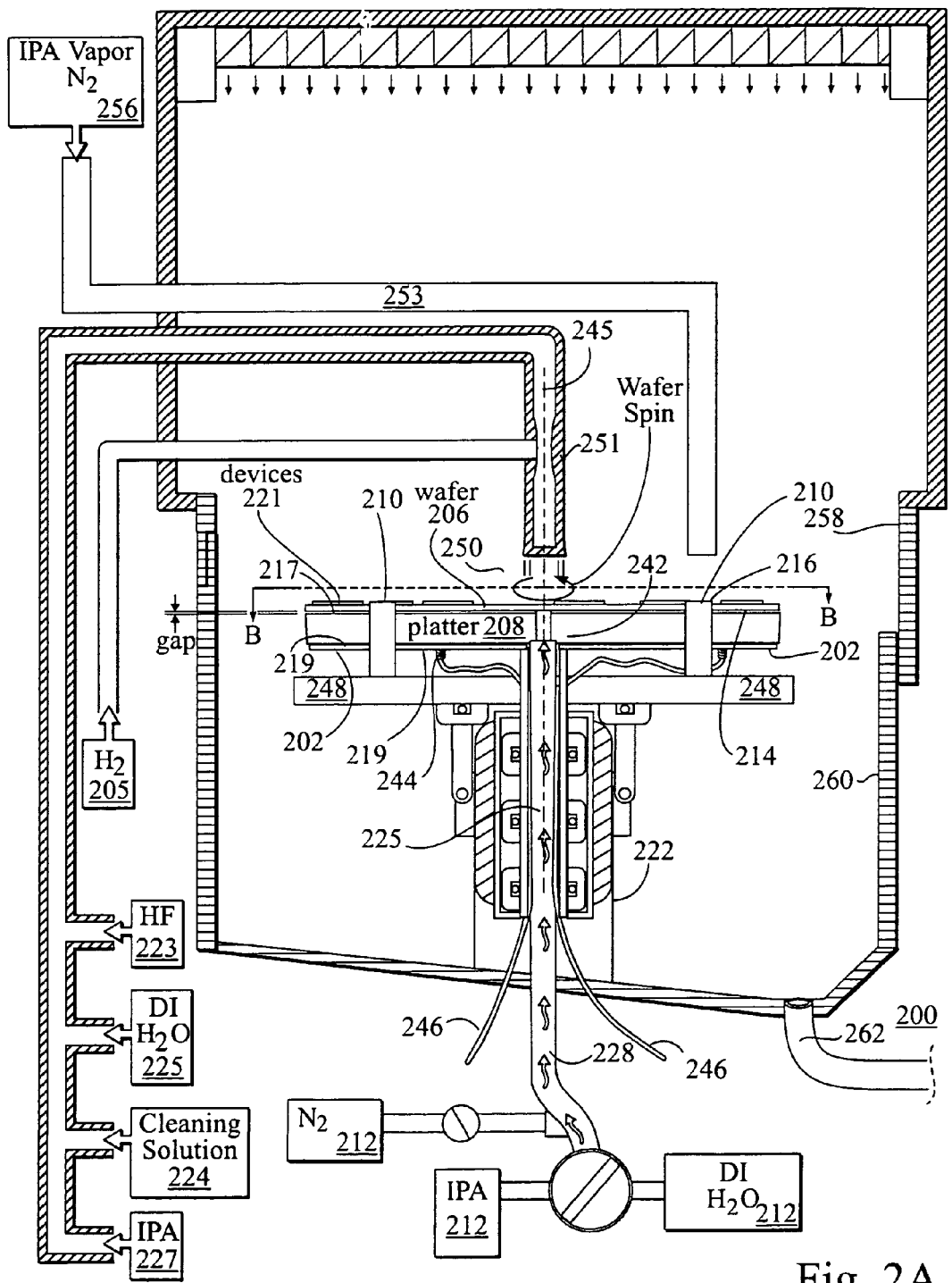
FIG. 2A is an illustration of one embodiment of a megasonic single wafer cleaning chamber.
Figure 2B:
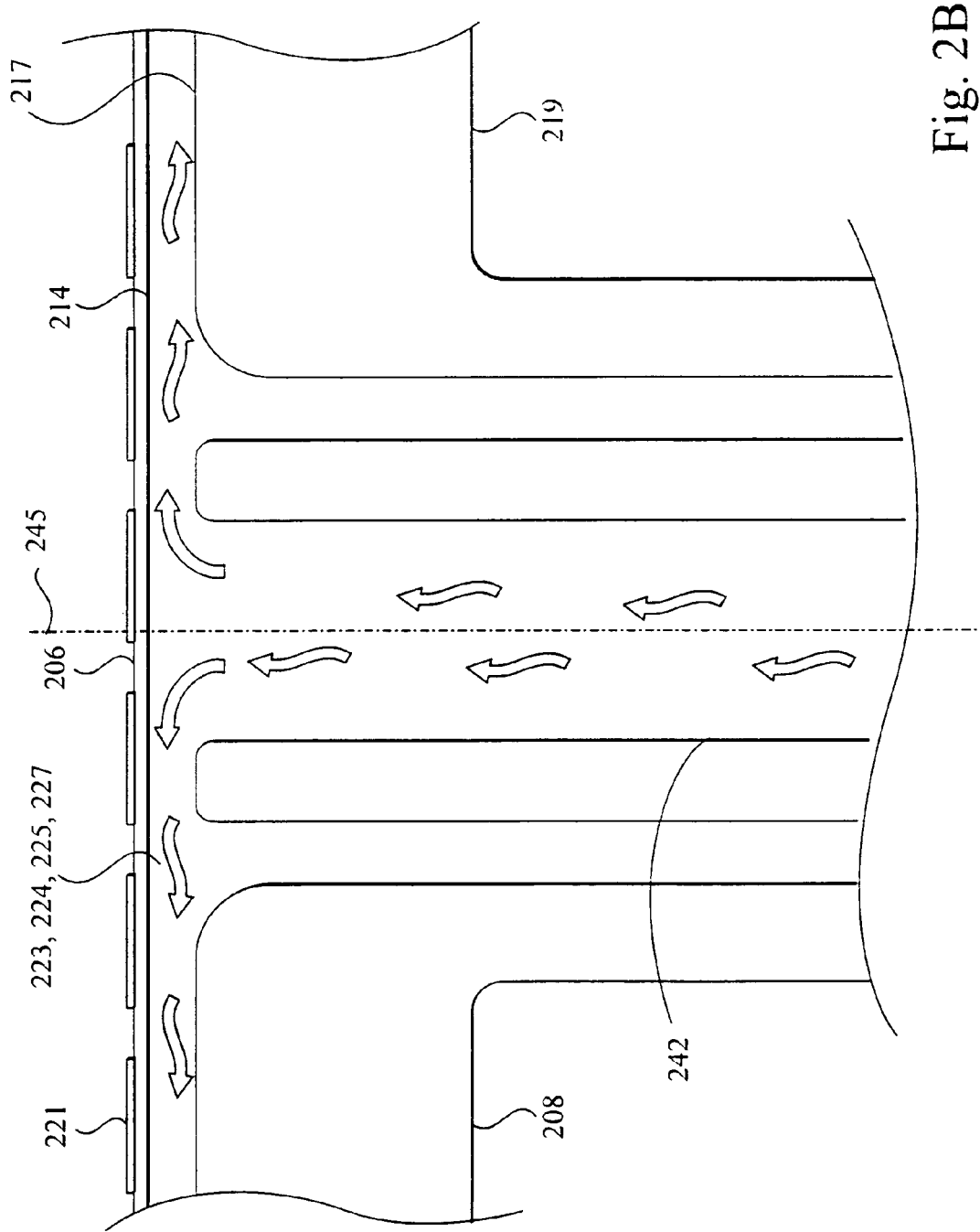
FIG. 2B is an illustration of one embodiment of the center-section of the platter and the wafer having a flow of chemicals therein.

FIG. 2A is an illustration of one embodiment of a megasonic single wafer cleaning chamber. FIG. 2B is an illustration of one embodiment of the center section of the platter and the wafer having a flow of chemicals therein. The megasonic single wafer cleaning chamber 200 can incorporate the methods, features and benefits of the single wafer cleaning chambers 100 and 101 illustrated in FIGS. 1A & 1B. Within the cleaning chamber 200, megasonic energy is generated by one or more acoustic wave transducers (transducers) 202 attached to the platter 208 and the megasonic energy can pass into the wafer 206 through chemicals 212 in contact with both the wafer 206 and the platter 208. As a result, the wafer 206 can be cleaned with a variety of combinations that include wafer rotation, megasonic energy, and chemical action, all under temperature control. Between and after the cleaning and rinsing cycles, the single wafer cleaning chamber 200 can dry the wafer 206.

The platter 208 has a topside 217 and a bottom side 219, with the set of transducers 202 attached to the bottom side 219. The platter topside 217 can be facing the wafer 206. The platter 208 is fixed in this embodiment, but alternate embodiments can have the platter 208 able to translate along the bracket rotation axis 245 to open the gap during wafer rinse or dry cycles. The robot arm (not shown) can place the wafer 206 in the rotatable wafer holding bracket (bracket) 248 such that the wafer device side 216 is facing up and away from the platter 208. When placed in the bracket 248, the wafer 206 can be centered over and held substantially parallel to the platter 208 to create the gap. The gap distance is approximately 3 mm but can fall within the range of approximately 1-5 mm. Positioned beneath the platter 208 can be an electric motor 222 for rotating the bracket 248. A through hole 225 can exist in the electric motor through which is passed the wiring 246 from the platter 208 as well as a tube 228 that can transfer the chemicals 212 to the feed port 242.

Referring still to FIG. 2A, the platter 208 can have an approximate 0.190" diameter through-hole 242 that acts as a feed port for the chemicals 212 dispensed from below. This feed port 242 can be located at the center of the platter 208 or the feed port 242 can be placed off-center by up to a few millimeters (not shown). Attached to each of the acoustic wave transducers 202 can be a copper spring 244. The spring 244 could be of a variety of shapes to maintain electrical contact such as a wire coiled shape (shown) or a flexed foil constructed from sheet metal (not shown). Soldered to the spring 244 free ends are the wiring leads 246 to form the electrical connections. The platter 208 can be connected to the cleaning chamber 200 so as to act as ground for the electrical connections 244 and 246 to the acoustic wave transducers 202.

In one embodiment, located above the platter 208 and the wafer 206, may be positioned a nozzle 251. Through the nozzle 251 can pass a second set of chemicals 223, 224, 225, and 227 (second chemicals) during processing. The nozzle 251 can direct a fluid flow 250 onto the wafer device side 216 with each of the chemicals 223, 224, 225, and 227 in the cleaning process. The nozzle 251 can apply the chemicals 223, 224, 225, and 227 to the wafer 206 while the wafer 206 is not moving or while the wafer 206 is spinning. The nozzle 251 can apply the chemicals 223, 224, 225, and 227 at a flow rate to maintain a coating of the chemicals 223, 224, 225, and 227 on the wafer device side 216 surface with minimal excess.

The nozzle 251 can apply a continuous chemical flow to maintain a film thickness on the wafer 206 of at least 100 microns. To keep the chemical film at the 100 microns thickness, the chemicals 223, 224, 225, and 227 may be converted at the nozzle 251 into a mist having a particular mean diameter droplet size. All nozzle designs are limited as to how small a droplet size they can create. To meet the requirements of minimal fluid usage, a further reduction in droplet size may be required. One method of reducing the droplet size beyond a theoretical limit is to entrain a gas into the chemicals. The nozzle 251 can entrain or dissolve enough $H_2$ gas 205 or any other gas from the group of $O_2$, $N_2$, Ar, or He into the chemicals 223, 224, 225, and 227 to further reduce the mean droplet size. And in addition, entraining the gas 205 can have the added benefit of optimizing cavitation within the chemicals 223, 224, 225, and 227 when the megasonics are applied.

Figure 3:
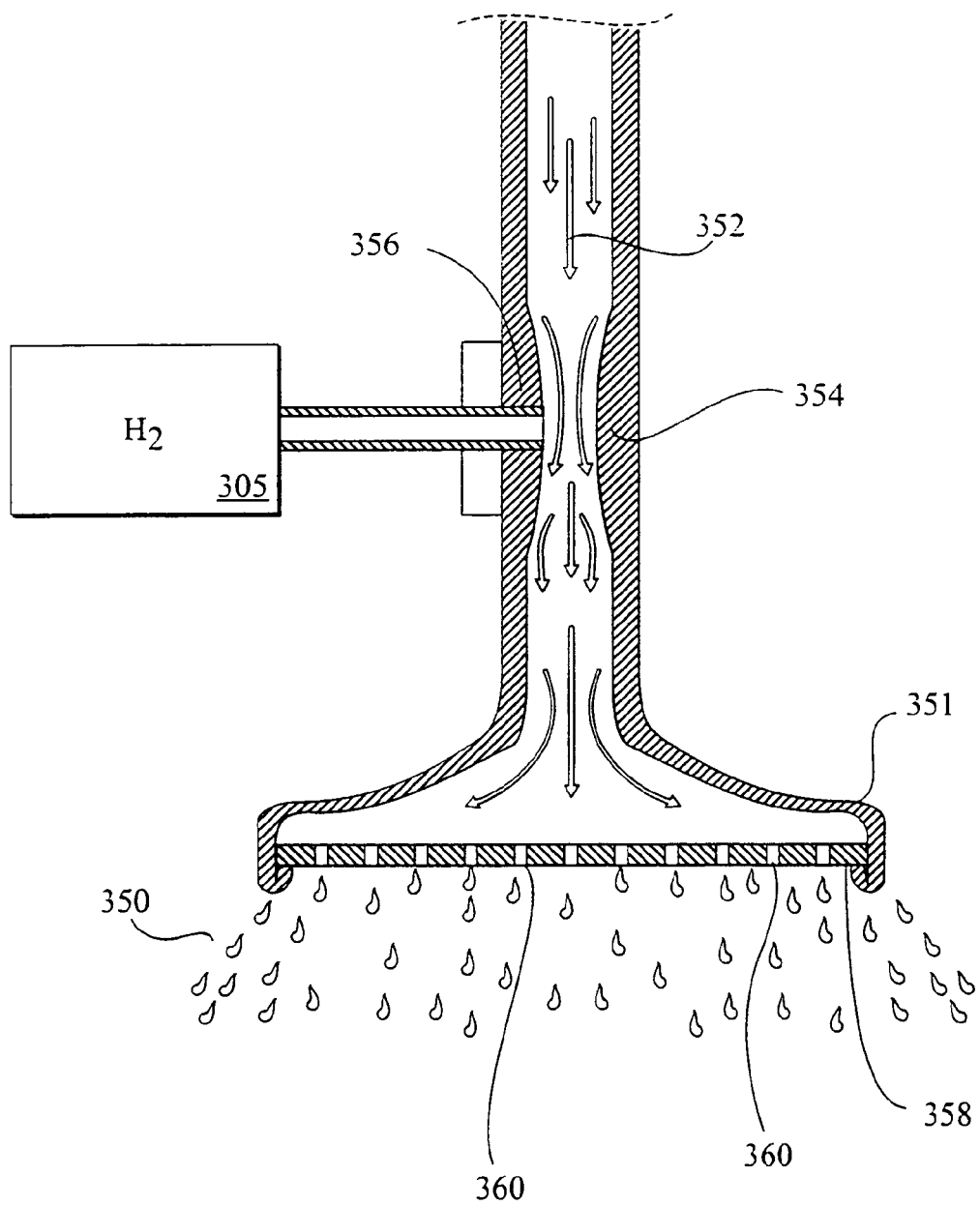
FIG. 3 is an illustration of an embodiment of a venturi nozzle design.

FIG. 3 is an illustration of an alternate embodiment of a venturi nozzle design. The nozzle, in the shape of a "showerhead", is provided as an illustration of the use of a venturi to draw gases into the flow of cleaning chemicals. The venturi shape can inject a gas source 305 such as $H_2$ into the fluid steam 352 before the fluid stream 352 passes out holes 360 in a plate 358 in the nozzle 351 as a spray 350. Using this approach, the chemicals flow past a throat 354, which increases the flow rate thereby reducing the fluid pressure. A small hole (injector port) 356 is placed in the throat 354 and is attached to a gas source 305 such as $H_2$. As the fluid stream 352 passes by the injector port 356, the gas 305 is drawn into the lower pressure of the fluid stream 352. Alternatively, the gas 305 may simply be injected into the fluid stream 352 under sufficient pressure thereby avoiding the need for a venturi design (not shown). Other approaches (not shown) for entraining gas into the chemicals can be to bubble the gas into each cleaning fluid or to mist the cleaning fluids through a volume or stream of gas. The gas-entrained chemicals then exit the nozzle 351 through a perforated surfaced 358 where the perforations 360 are sized to generate a particular mean droplet diameter.

Figure 4A:
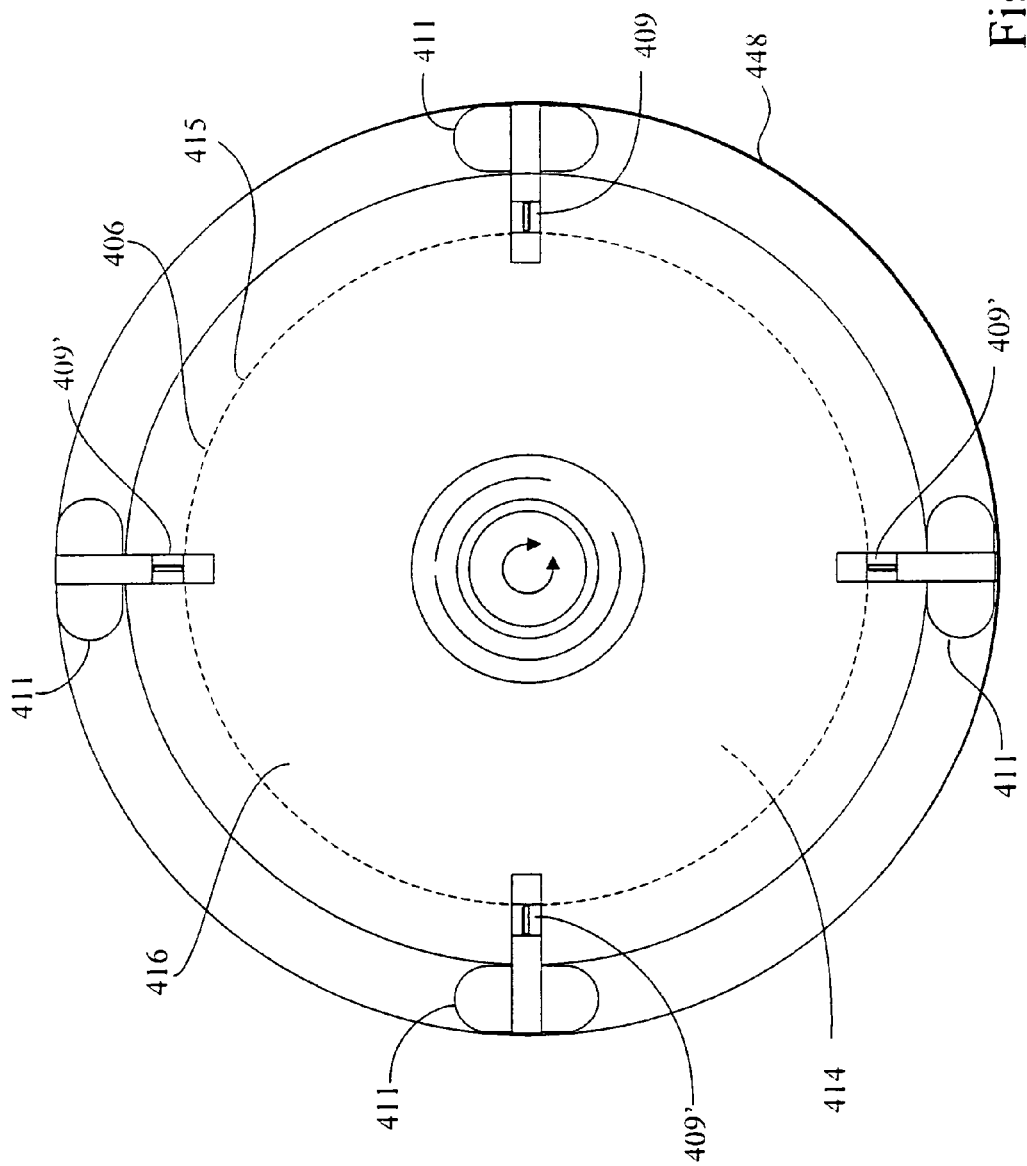
FIG. 4A illustrates in a top view, one embodiment of the rotatable wafer holding bracket (bracket).
Figure 4B:
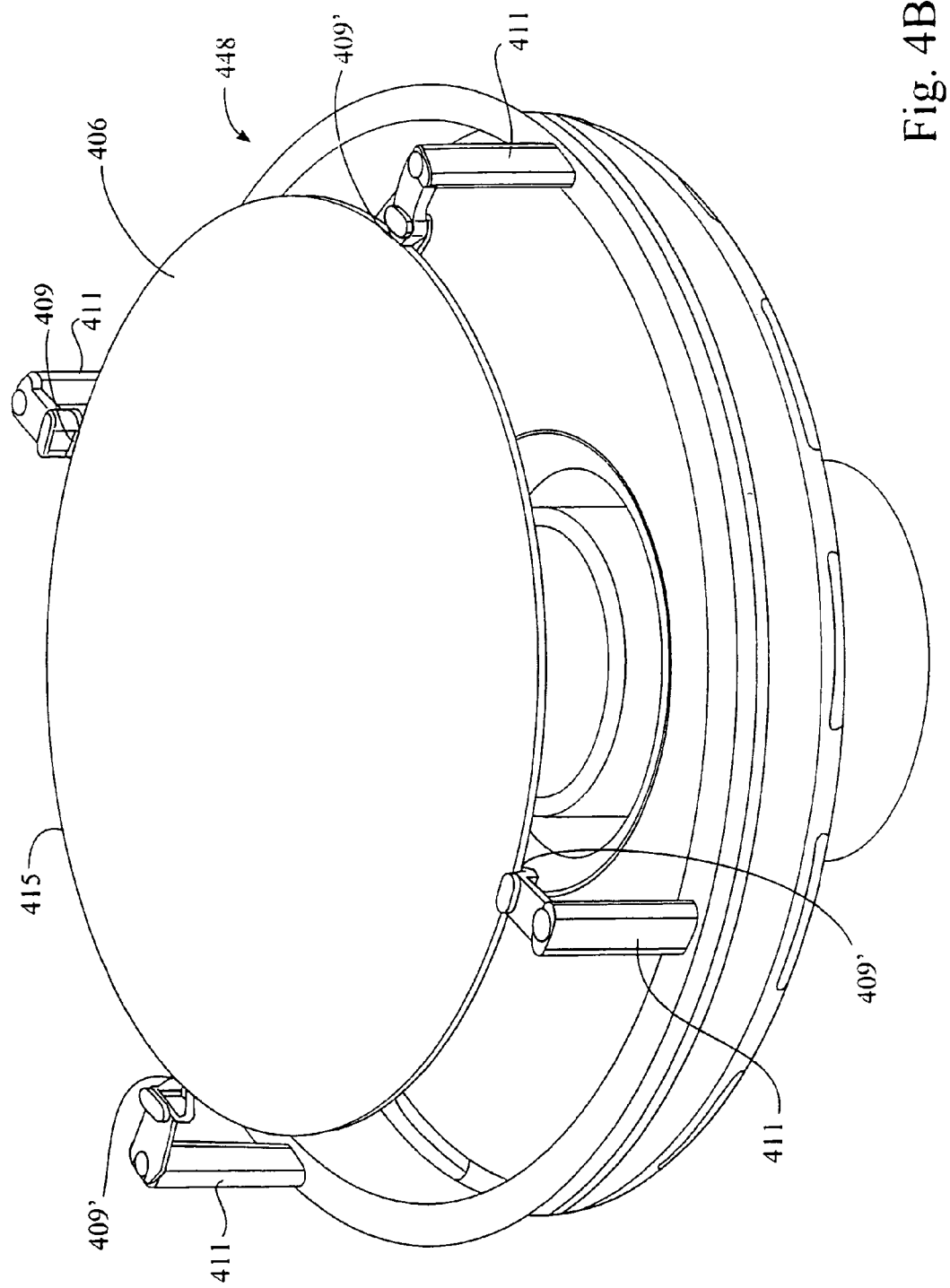
FIG. 4B illustrates the bracket in a 3D perspective view.

FIG. 4A illustrates in a top view, one embodiment of the rotatable wafer holding bracket (bracket). FIG. 4B illustrates the bracket in a 3D perspective view. The wafer 406 (shown in dashed line) can be held in place by the bracket 448 to position the wafer 406 parallel to and near the platter (not shown for clarity). Initially, the bracket 448 can hold the wafer 406 by gravity at four points 409 and 409' along the wafer edge 415 such that the wafer front side 416 and the wafer backside 414 are clear of the bracket 448 structure and fully exposed to both cleaning/rinsing liquids and thus to megasonic energy. The number of points of contact 409 and 409' for the bracket 448 with the wafer 406 can be three or more and can be made with an elastomeric material such as a plastic or rubber to friction grip the wafer 406 during the start and stop phases of rotation. In one embodiment, the contact points are O-rings that are positioned at the ends of bracket support posts (posts) 411 where the posts 411 have been given an airfoil shape to minimize vibrations during high-speed rotations.

Figure 4C:
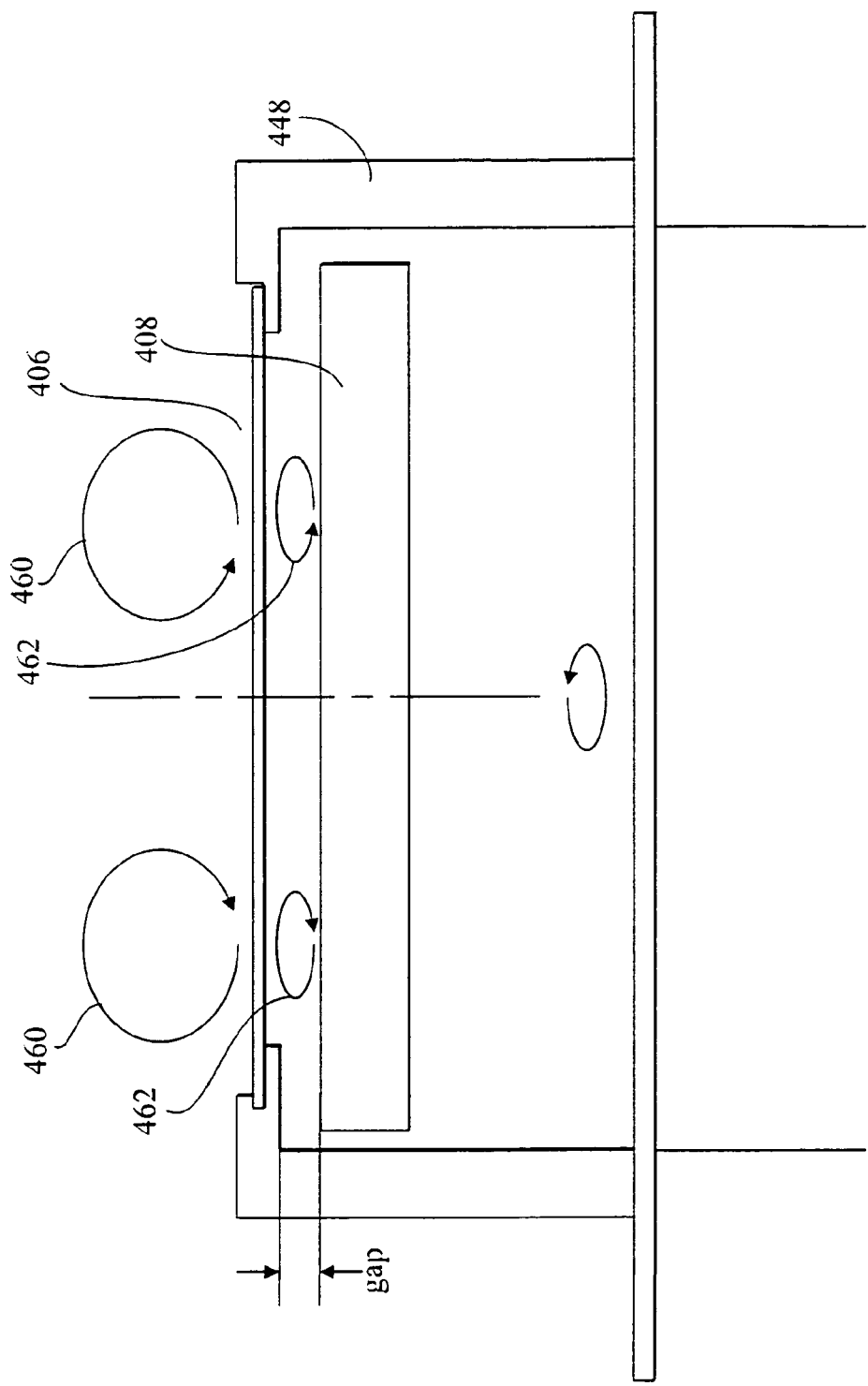
FIG. 4C illustrates the effects of airflow above and below the wafer in the bracket rotating over a platter.

FIG. 4C illustrates the effects of airflow above and below the wafer 406 in the bracket 448 rotating over the platter 408. When there are no chemicals between the wafer 406 and the platter 408 (portions of the rinse cycle and the dry cycle), air can flow in circular swirls or patterns 460 and 462 during wafer 406 rotation. The gap (not to scale) between the platter 408 and the wafer 406 limits the area of airflow and as a result, air flow circulating above the wafer 460 is at a different flow rate than air flowing between the platter and the wafer 462. At the higher rinse and dry wafer rotation speeds, the difference in flow rate provides different pressures above and below the wafer 406 (Bernoulli forces), which can operate to provide a downward force acting on the wafer 406 that maintains the wafer 406 onto the bracket 448.

Referring again to FIGS. 2A and 2B, one embodiment of a method of use rotates the bracket 248 and the wafer 206 while the first cleaning solution 212 is applied from below to be in simultaneous contact with the platter 208 and the non-device side of the wafer 214. The second cleaning solution 223, 224, 225, and 227 is wetted out onto the device side 216 of the wafer 206. The acoustic wave transducers 202 generate megasonic waves through the platter 208 into the first cleaning solution 212, captured by the wafer 206 and the platter 208. The megasonic waves may be incident to the wafer non-device side 214 at an angle substantially normal (perpendicular) to the wafer surface 214. A percentage of the megasonic waves, depending on the frequency or frequencies used can pass through the wafer 206 to exit the wafer device side 216 and enter the second cleaning solution 223, 224, 225, and 227 that is a film on the wafer device side 216. The megasonic waves acting within the second cleaning solution 223, 224, 225, and 227 can produce cleaning on the wafer device side 216. For optimal throughput speed, the total area of the acoustic wave transducers 202 can be sufficient to provide approximately between 80-100% area coverage of the platter surface 219. The platter 208 diameter may be approximately the same size or larger than the wafer 206 diameter. The invention is scalable to operate on a wafer 206 that is 200 mm (diameter), 300 mm (diameter), or larger in size. If the wafer diameter is larger than the platter diameter, the vibrations from the megasonic energy striking the wafer 206 can still travel to the wafer 206 outer diameter (OD) providing full coverage for the cleaning action.

During the cleaning, rinse and dry cycles, the wafer 206 is rotated at a selected revolution per minute (rpm) about an axis 245 that runs through the bracket 248 pivot point. Additionally, to optimize any particular cycle, the wafer spin rate may be stopped or varied and the sonic energy varied by changing any combination of the power setting, the frequency or frequencies, and by pulsing. In one embodiment, the bracket 248, powered by the motor 222, can rotate the wafer 206 during cleaning operations at an rpm of approximately between 10-1000 and during the dry and rinse cycles at an rpm of greater than 250 rpm where a range of approximately between 250-6000 rpm is preferable. Therefore, when the bracket 248 is in operation, the wafer 206 is seeing a first cleaning solution 212 on the non-device side 214, a second cleaning solution 224 on the device side 216, while the wafer 206 is being rotated and radiated with megasonic energy.

Continuing with FIG. 2A, acoustic waves can first strike the wafer non-device side 214 where no devices 221 exist that could be damaged by the full force of the acoustic energy. Depending on the frequency or frequencies used, the megasonic energy may be dampened to a degree when passing through the platter 208 and wafer 206 to exit into the cleaning or rinse chemicals 223, 224, 225, and 227 at the wafer device side 216. As a result, the megasonic energy striking the wafer non-device side 214 may be powerful enough that only de-ionized (DI) water is used as the first cleaning solution 212.

A thin film (not shown) of the second cleaning solution 223, 224, 225, and 227 may be applied to wet the wafer device side 216 surface. If not DI water 225, the second cleaning solution 224 may be a stronger chemistry such as used in an RCA (Radio Corporation of America) cleaning process. The action of the megasonic energy on the device structures 221 is confined to a small volume (thin film) that contacts the device structures 221, absorbs the sonic waves, and maintains useful cavitation.

In an embodiment, megasonic energy is applied to the rotating wafer 206 throughout the cleaning process. The megasonic energy is in a frequency range of 400 kHz-8 Mz but may be higher. The RCA type cleaning process, along with the prior use of an etchant such as hydrofluoric acid (HF) 223 having a concentration of 0.5% by weight of HF, may be used on the wafer device side 216. The RCA cleaning process is commonly used and is well known to those skilled in the art. The RCA process or a similar cleaning process may include a first standard clean (SC-1) cycle ($NH_4OH+H_2O_2$) 224, a rinse (DI water 225 ending with IPA vapor in $N_2$), an SC-2 clean ($HCl+H_2O_2$) 224, a rinse (DI water 225 ending with IPA vapor in $N_2$), and a dry cycle (blowing $N_2$ on the rotating wafer 206). The application of IPA vapor in $N_2$ can be accomplished while DI water still exists on the wafer. As a result, some of the previous cleaning chemicals still remain on the wafer, immersed in the DI water. The use of start of IPA vapor in $N_2$ blowing on the wafer can reduce the rinse time since it begins prior to complete rinse, i.e. complete removal of the cleaning chemicals by the DI water. The effect of the IPA vapor in $N_2$ is to assist the rinse cycle and shorten the rinse cycle duration. The IPA vapor in $N_2$ 256 can be applied through a second nozzle 253 to support a rinse cycle on the top side 216 of the wafer. The second nozzle 253 can be placed off-center to the wafer axis of rotation 245. In yet another embodiment (not shown), more than two nozzles can be used which can be positioned in a variety of other patterns, such as equally distant from the axis 245, so as to provide chemical and gas coverage onto the topside 216 of the wafer.

The wafer non-device side 214 may have the same cycles of clean, rinse, and dry or could use only DI water 212 in the clean and rinse cycles. The temperature of the cleaning chemicals, as well as the rinsing chemicals, etchants, and gasses can be between 15-85° C. during use. A drain 262 may be provided within the cleaning chamber housing 260 to collect the cleaning fluids. A cleaning chamber floor 263 may be angled toward the drain 262 to improve flow of the chemicals 212, 223, 224, 225, and 227 to the drain 262.

Cleaning of the wafer backside (non-device side) surface 214 may be accomplished in a different manner. Because the acoustic energy is higher on the backside of the wafer, no RCA type cleaning solutions 224 may be necessary. The vibrations alone in water may be sufficient to separate the particles from the wafer 206 and move them away. DI water 212 may be selected as the medium to transfer the acoustic energy in the area around the wafer backside 214 for both the cleaning and rinse cycles. In one embodiment, non-gas entrained DI water or even de-gassed DI water is preferred for use on the wafer backside 214. The DI water 212 is fed through the tube 228, the feed port 242, and onto the wafer backside surface 214 at a sufficient rate to continually fill the area between the platter 208 and the wafer 206 which will guarantee constant fluid contact with the wafer surface 214. The DI water 212 can be vacuum degassed before directing it to the fluid inlet port 242, by passing the DI water 212 through a membrane degassifier (not shown) such as with Liqui-Cel membrane contactors such as supplied by Celgard (Charlotte, N.C.). Alternatively, if a vacuum is placed on the gas side of the membrane, most of the dissolved gases can be removed from the incoming DI water 212. Alternatives to the rinse and dry cycles can include the rinse cycle using IPA along with or instead of $H_2O$, and the dry cycle may use wafer spinning and an inert gas such as $N_2$.

In one embodiment there is little use and no reuse of cleaning solutions. This is a result of the small volumes of chemicals used in the process such that it is efficient to use the chemicals once and then discard them. With such a small volume of chemicals used, the single pass concept is economical and does not increase the burden to the environment. With the present invention, spraying a thin film may use 1/10 or less the water volume as compared to existing wafer megasonic batch processes using immersion. To reduce chemical use, the bracket 248 may be rotated initially at a first speed to dispense the first chemical 212 onto the non-device side 216 of the wafer 206 and to dispense the second chemical 223, 224, 225, and 227 onto the device side 216 of the wafer 206. Once dispensed, the bracket rotation speed can be slower than the first speed while megasonics are applied to the wafer non-device side 214. The bracket 248 can then be rotated at a speed higher than the first speed to rinse the wafer 206 and the bracket 248 rotated at a speed higher than the first speed to dry the wafer 206.

After the chemicals are dispensed, the wafer rotation is slowed so that the first chemicals 212 can remain trapped between the wafer and the platter as well as keeping the second chemicals 223, 224, 225, and 227 wetted out on the wafer opposite side. In one embodiment, the initial wafer spin rate can in the range of approximately 50-300, where an rpm of 150 is preferable, while the cleaning solutions 212, 224, and 225 are applied. In one embodiment, once the device side 216 of the wafer 206 is wetted with the chemicals 224 or 225, the wafer rotation speed may be reduced to a range of approximately 10-50, where an rpm of approximately 15 is preferable, and/or the cleaning solutions 224 or 225 applied at a lower rate, which in either case can reduce the cycle time and result in conserving chemical use. Finally, in one embodiment, after the cleaning process, during a rinse and/or dry cycle, the rpm can be increased to over 1000 to remove the chemicals remaining on the wafer 206.

The use of chemicals can be further decreased by wetting the wafer surface 216 with a finer spray of chemicals as opposed to a more coarse spray or even a solid stream of liquid. The finer spray can be achieved through an effective design of one or more nozzles 251 to apply the cleaning solution, by adjusting the temperature of the cleaning solution applied, by adjusting the chamber pressure acting on the spray, the fluid pressure in the nozzle 251, the chemical makeup of the cleaning solutions 223, 224, 225 or 227, and the amount and type of entrained gases 205 within the cleaning solution 223, 224, 225, and 227.

When the chemicals are not reused, the use of the platter 208 has the benefit of containing the various liquids 223, 225, 224, and 227 that would otherwise fall by gravity from the wafer non-device side surface 214. Containing the cleaning liquids 223, 224, 225, and 227 against the wafer 106 can reduce cleaning liquid use, optimize the acoustic energy transmitted from the platter 208 to the wafer 206 and can allow the cleaning liquids 223, 224, 225, and 227 to act longer on the wafer surface 214. Finally, cleaning solutions 223, 224, 225, and 227 applied to the wafer non-device side, can be more dilute, i.e. made of a higher concentration of water, which will further reduce cleaning chemical consumption.

After the last rinse cycle is complete there can be a dry cycle to dry the wafer. During the dry cycle, a few milliliters of isopropyl alcohol (IPA) vapor, mixed with nitrogen gas ($N_2$), can be injected through the fluid feed port 242 to contact the wafer device side 216 and non-device side 214. The IPA, having a lower surface tension than water, will wet out the surface better and form a smaller boundary layer. The combination of high wafer rpm, IPA vapor as a wetting agent, and $N_2$ gas pressure striking the wafer 206 reduces the drying time for the wafer 206.

Figure 5A:
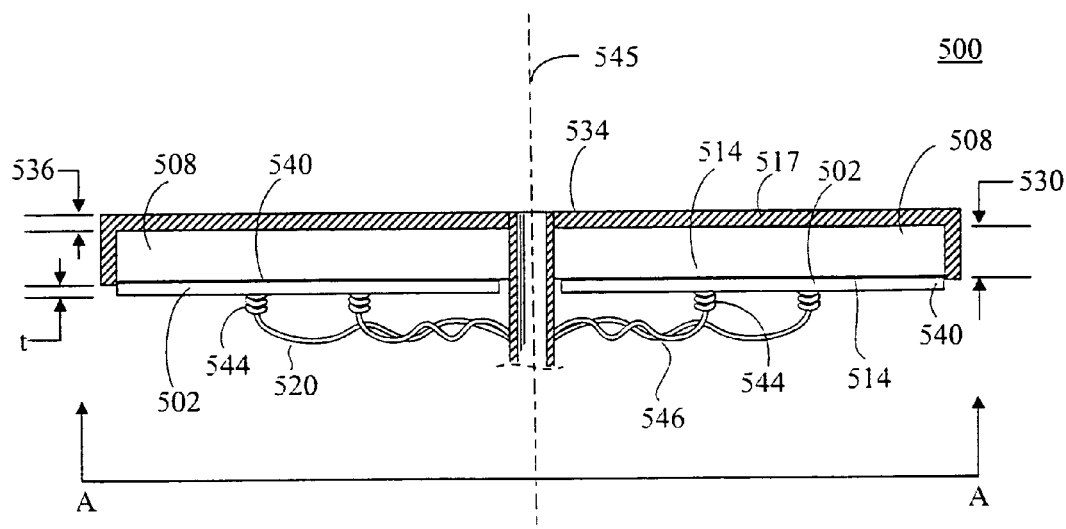
FIG. 5A is an illustration of a cross-section of one embodiment of the platter.

FIG. 5A is an illustration of a cross-section of one embodiment of the platter 500. The platter 508 can be made of aluminum that is polished and may have a surface finish of 16√ or smoother and having an approximate 300 mm diameter. Alternatively, it should be noted that the platter 508 can be made from a variety of materials such as sapphire, stainless steel, tantalum, or titanium. The platter 508 is approximately 3.43 mm thick (530) and the platter front side 517 can be coated with a protective fluoropolymer 534 such as Halare® (Ausimont USA, Thorofare, N.J.), having a coating thickness (536) of between 0.015-0.045". The platter backside 514 can have one or more acoustic wave transducers 502 bonded directly to the aluminum with an electrically conductive epoxy adhesive or a solder having an adhesive/solder thickness 540 of approximately 0.001-0.010". The opposite side of each of the one or more acoustic wave transducer 502 can be flexibly attached 544 to electrical wiring 520 to provide power at a frequency while the platter 508 can be connected to ground.

Figure 5B:
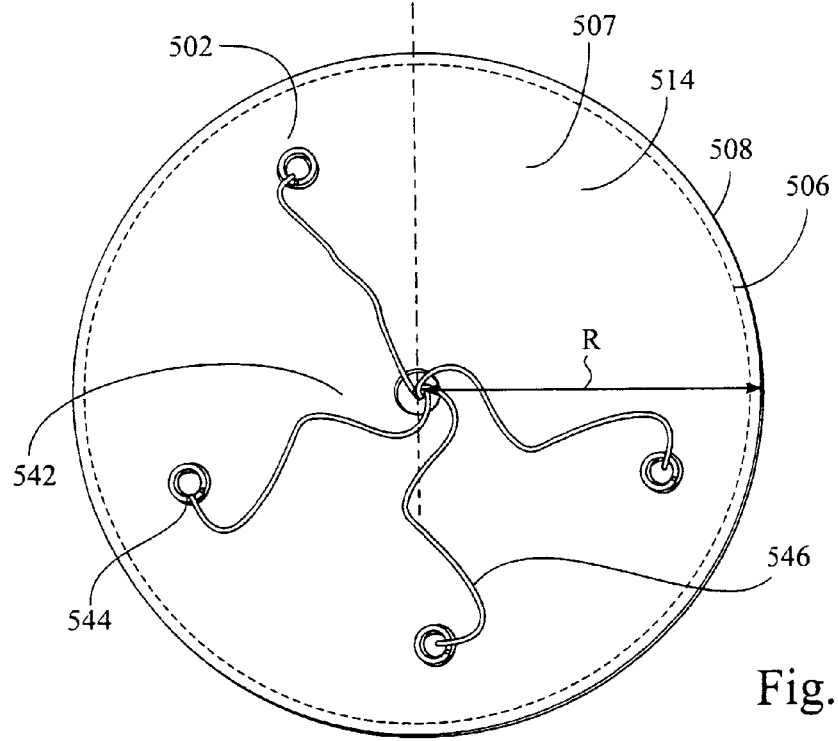
FIG. 5B is an illustration of a bottom view of one embodiment of the platter assembly showing a single acoustic wave transducer attached to the platter.

FIG. 5B is an illustration of a bottom view of one embodiment of the platter 500 showing a single acoustic wave transducer attached to the platter. The shape shown is circular; however, any number of individual acoustic wave transducers 502, made into any shape such as square, round, or rectangular, can be used to meet area coverage and manufacturing requirements. If more than one acoustic wave transducer 502 is used, the acoustic wave transducers 502 can be positioned close together so as to provide the 80% or greater coverage of the platter backside 514 surface area. The wafer 506 (dashed), upon receiving megasonic energy to a portion of the wafer backside surface 507, can transmit that megasonic energy to the entire wafer backside surface 507. This complete coverage of the wafer backside surface 507 can occur if the megasonic energy from the platter 508 is incident to between 50-100% of the wafer surface backside surface 507, however, optimal throughput can require the 80-100% coverage, with 90-100% coverage preferred. In one embodiment, 80% or greater acoustic wave transducer coverage on the platter 508 is provided and as a result, megasonic energy will be applied to the entire wafer backside surface 507 dramatically reducing the cycle time and hence increasing the throughput of wafers. In another embodiment (not shown) the bracket can translate the wafer in linear travel, without rotation, to pick up acoustic energy over the entire wafer surface.

Acoustic wave transducer thickness t (FIG. 5A) can be sized to generate sound at a particular frequency. When a signal, generated at the frequency for which the transducer has been designed to respond, arrives at the transducer, the transducer will vibrate at that frequency. A typical acoustic wave transducer is made from a piezoelectric material having a thickness of 0.098", which is designed to respond to a frequency of 920 kHz. For a 300 mm wafer 506 (dashed to show a position on the opposite side of the platter 508 in FIG. 5B), the frequency of 5.4 MHz has a special utility in that the 300 mm wafer 506 is transparent for those sound waves. At 5.4 MHz±30%, the sound waves can travel substantially through the wafer 506 to exit the opposite wafer surface. To obtain a frequency of 5.4 MHz, the thickness of the acoustic wave transducer 502, as well as each thickness of all the other layers (platter 508 and adhesive/solder 540, FIG. 5A), are multiplied by a factor 920/5400=0.17 or alternatively the layer thicknesses of the acoustic wave transducer piezoelectric material, adhesive, and aluminum platter are to be divided by a factor of 5.87. This will provide for a transducer to respond to a frequency of 5.4 MHz and for a reduced bounce back from the other layers of materials 508 and 540, that the sound must pass through on its way to the wafer 506. An exception may be the thickness 536 of the fluoropolymer coating 534 (not to scale) which can be kept similar in all embodiments. In one embodiment, the piezoelectric material is a ceramic of lead zirconate titanate with the transducer 502 manufactured by Channel Industries, Inc of Santa Barbara, Calif. In one embodiment, an efficiency of at least 30% of the energy applied to the transducers 502 can reach the wafer 506.

Figure 5C:
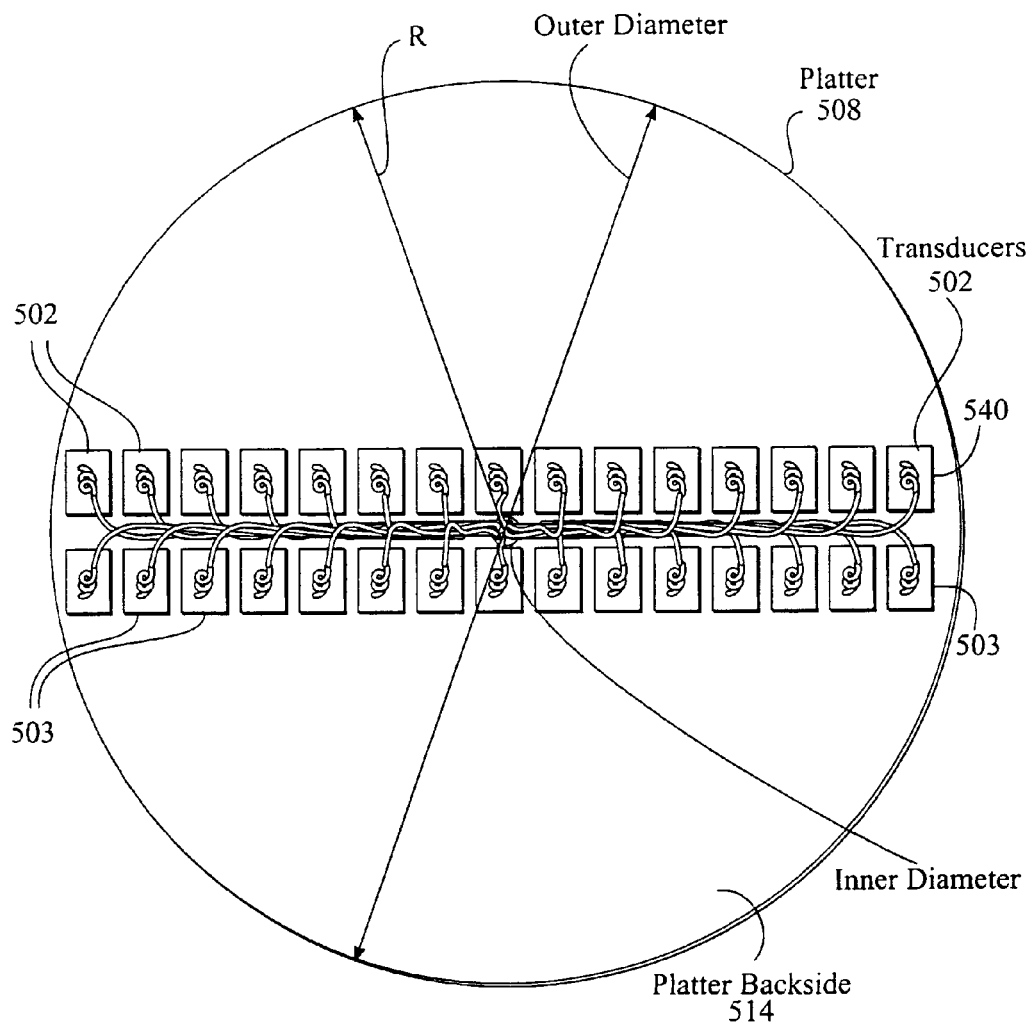
FIG. 5C is an illustration of one embodiment having acoustic wave transducers positioned in a strip fashion on the platter.

FIG. 5C is an illustration of one embodiment having acoustic wave transducers positioned in a strip fashion on the platter. The acoustic wave transducers 502 and 503 linearly placed on the platter backside 514 can run a distance on the platter surface 514. The acoustic wave transducers 502 and 503 on the platter backside 514, could be positioned as a strip that runs at least substantially the diameter (referring here to the outer diameter) of the platter 508 covering approximately 40% of the platter backside 514 area. The acoustic wave transducers 502 may transmit at a frequency that is different from the other acoustic wave transducers 503. In one embodiment the acoustic wave transducers 502 can form one strip while the acoustic wave transducers 503 form a second parallel strip. In an alternate embodiment (not shown) the acoustic wave transducers 502 and 503 can be uniformly mixed. In another embodiment (not shown), the acoustic wave transducers could be a strip that runs substantially a radius (R), the distance from the platter inner diameter to the platter outer diameter. For this embodiment, the acoustic wave transducers 502 and 503 could cover approximately 20% of the platter backside 514 surface area. As a result of less than 80% acoustic wave transducer coverage of the platter, the wafer throughput may be reduced if the power is not increased to compensate, but complete coverage of each wafer with megasonics can still be maintained.

The effectiveness of cleaning by sound, in particular removing particles, can be related to frequency, and different sized particles can be more effectively removed with different megasonic frequencies. Currently, a large percentage of the particles to be removed from a wafer (not shown) exist in the 0.3 μm (micron) and 0.1 μm sizes. It has been determined that in cleaning wafers, the megasonic removal of particles in the 0.3 μm size range is efficient in the 900 kHz range while the megasonic removal of particles in the 0.1 μm range is efficient in the 1.8 MHz range. In one embodiment, to provide two different frequencies to a wafer for megasonic cleaning, a single signal is sent to all of the transducers that contains a combination of frequencies superimposed. The different transducers that exist on the platter will each only respond to the corresponding frequency they are sized for. In this manner, within the single signal, individual frequencies can be added and subtracted or power varied, for each frequency throughout the wafer processing cycles.

Figure 6B:
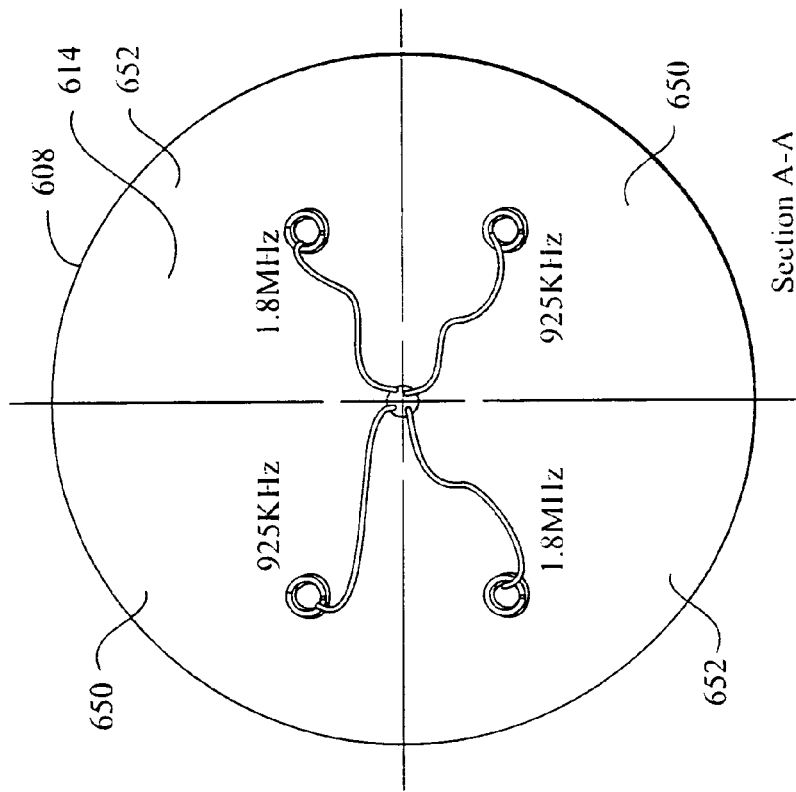
FIG. 6B illustrates an alternate embodiment of the platter having two groups of acoustic wave transducers in diagonal quadrants.
Figure 6A:
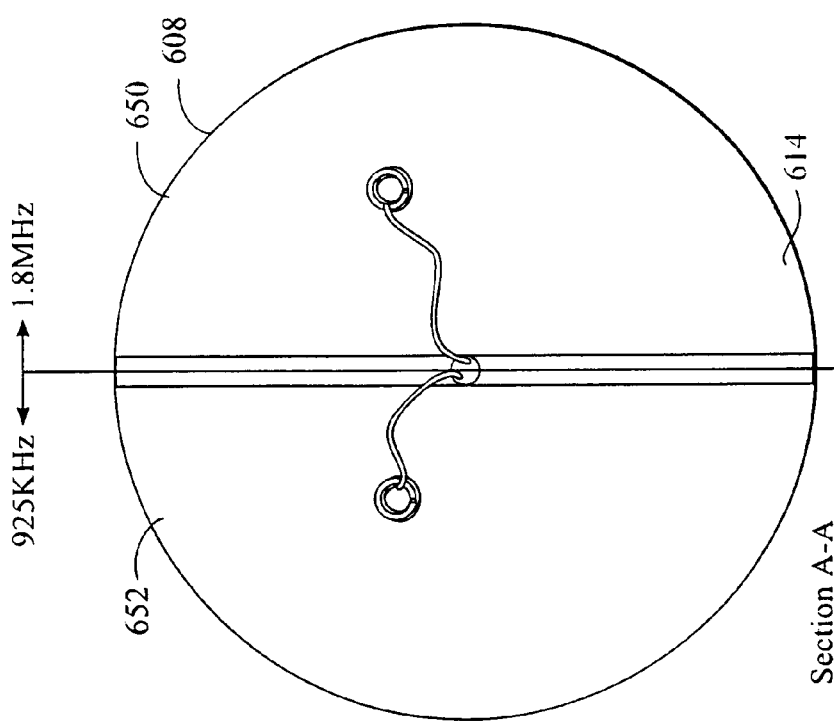
FIG. 6A illustrates one embodiment where a half circle of the platter surface is coated with a first acoustic wave transducer that vibrates in the 925 kHz range and the remaining platter half is covered with a second acoustic wave transducer vibrating in the 1.8 MHz range.
Figure 6C:
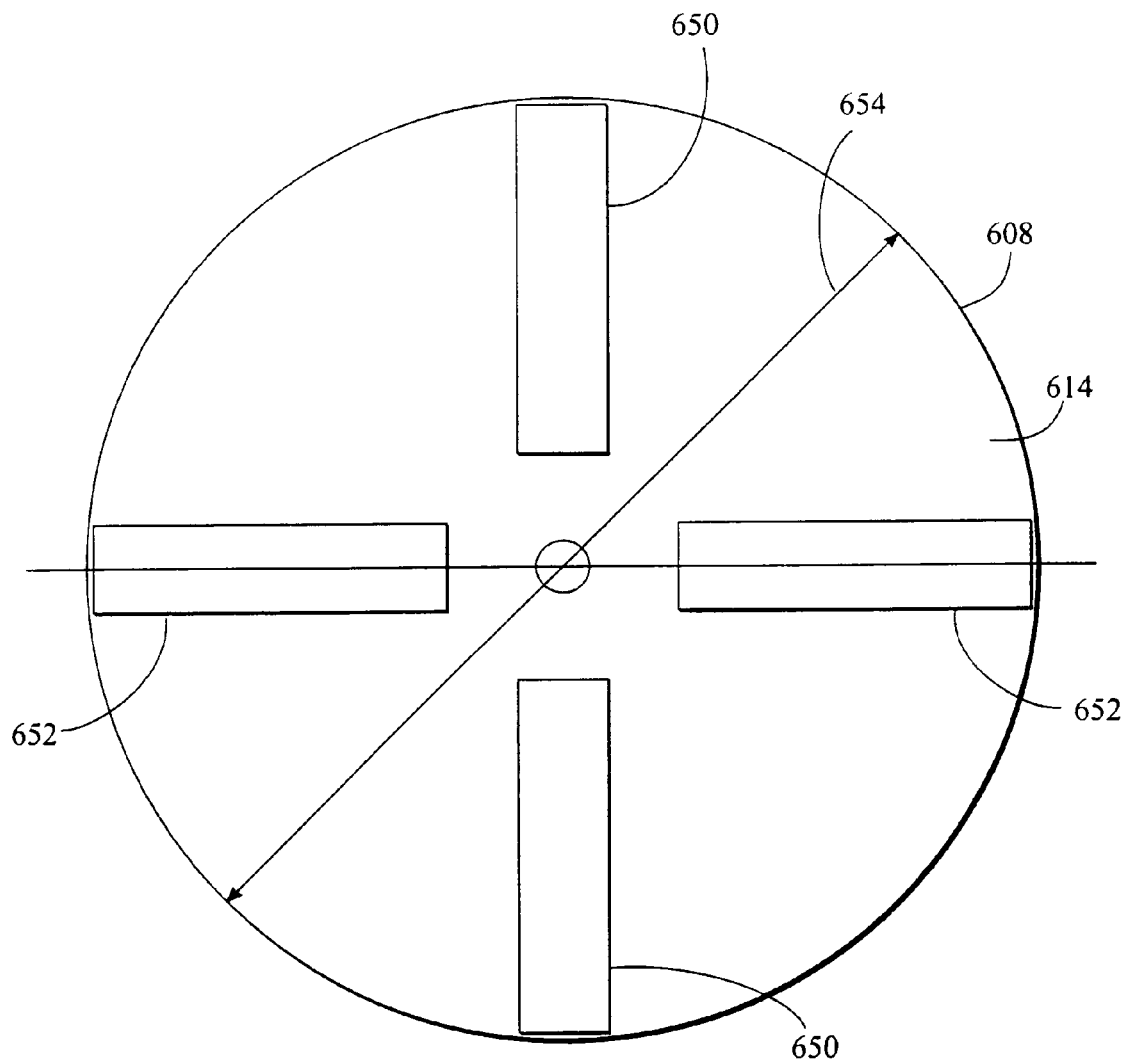
FIG. 6C illustrates an alternate embodiment where the platter has two groups of transducers positioned on the platter in linear strips that each runs substantially the diameter of the platter surface.

FIGS. 6A, 6B, & 6C illustrate one embodiment of acoustic wave transducers 650 and 652 that output more than one frequency. It has been determined that there is a relationship between the size of the particle to be removed and the effectiveness of the megasonic frequency to remove that particle. When cleaning a wafer, particle sizes to be removed are often in the 0.3 micron (μm) and 0.1 micron sizes. Megasonic frequencies in the 925 kHz range have been found to be effective at removing particles having a diameter of approximately 0.3 μm, and megasonic frequencies in the 1.8 MHz range have been found to be effective at removing particles having a diameter of approximately 0.1 μm. The acoustic wave transducers 650 and 652 are attached to the platter 608 where some of the acoustic wave transducers 650 output a frequency that is different from the remaining acoustic wave transducers 652. FIG. 6A illustrates one embodiment where a half circle of the platter surface 614 is coated with a first transducer 650 that vibrates in the 925 kHz range and the remaining platter half is covered with a second transducer 652 vibrating in the 1.8 MHz range. As the wafer (not shown) rotates, the entire wafer is radiated with both frequency ranges. Even though these transducers 650 and 652 are not vibrating at the 5.4 MHz frequency to be transparent, sufficient energy can still reach the wafer to be effective in cleaning.

A variety of transducer placement arrangements are possible to transfer multiple frequency acoustic energy to the wafer. A few additional transducer arrangements are described below but the invention is not limited to them. FIG. 6B illustrates an alternate embodiment of the platter 608 having two groups of transducers 650 and 652 in diagonal quadrants. FIG. 6C illustrates an alternate embodiment where the platter 608 has two groups of transducers 650 and 652 positioned on the platter in linear strips that each runs substantially the diameter 654 of the platter surface 614. In an embodiment, each transducer group 650 and 652 covers approximately 20% of the platter surface area 614. In the embodiments using the half circle transducer placement (FIG. 6A), the quadrant transducer placement (FIG. 6B), and the linear strip placement (FIG. 6C), rotation of the wafer (not shown) will allow both frequencies to strike at least 80% of the wafer surface. As a result of less than 80% acoustic wave transducer coverage, the through put may If the transducers 650 and 652 are not generating at the 5.4 MHz frequency, i.e. transparent for the conditions that drove the 5.4 MHz selection, the various thicknesses making up the transducers 650, and 652, adhesives 540 (FIG. 5B), and platter 608 can still be sized to minimize acoustic reflection and improve efficiency of the sound waves reaching the wafer. With an embodiment having a first group of transducers vibrating at a frequency approximately twice that of the second group of transducers, a platter thickness 530 (FIG. 5A) selected to minimize reflection for one transducer group 650 frequency will be equally efficient at reducing reflection for the other transducer group 652 frequency. The use of two frequencies has been given in the above embodiments for purposes of example, however, it should be appreciated that any number of different frequencies could be provided and that the percent of coverage from each transducer type producing each of the frequencies could be varied. When a platter thickness has been selected that minimizes reflection from one frequency, all of the other frequencies that will be applied can also have minimized reflection if the ratio of each frequency used is an integer multiple of the lowest frequency.

Figure 7:
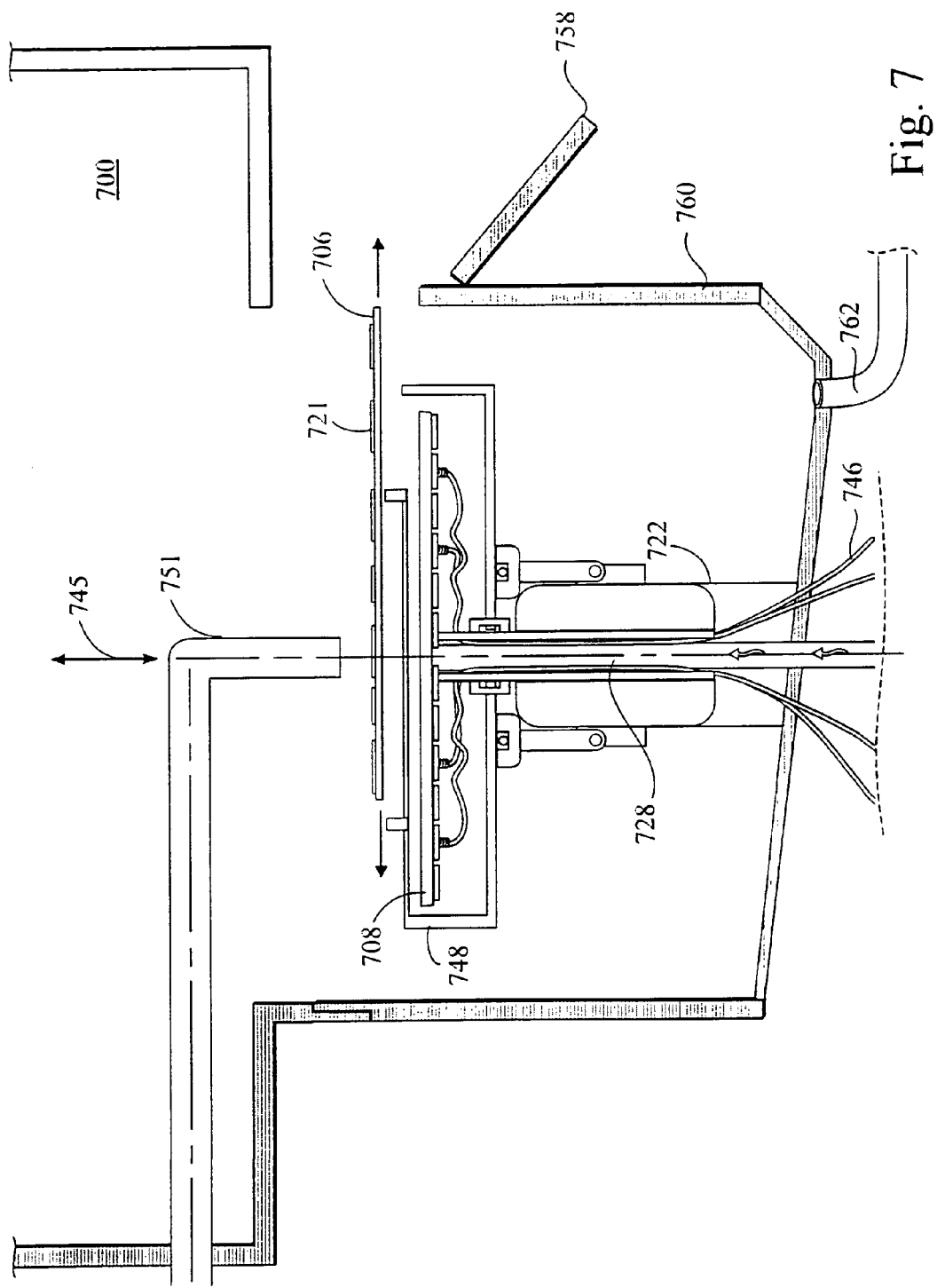
FIG. 7 is an illustration of wafer removal for one embodiment of the cleaning chamber.

FIG. 7 is an illustration of wafer removal for one embodiment of the cleaning chamber 700. During wafer 706 removal, an alternate bracket 748, and the nozzle 751 can translate along an axis 745, moving upward approximately 1" to allow for wafer 706 engagement with the external robot arm (not shown). Next, a cleaning chamber door 758 moves to provide access to the cleaning chamber housing 760. With this opening, the robot arm can enter the cleaning chamber housing 760, engage and remove the wafer 706, and replace it with the next wafer (not shown) to be cleaned. In this manner, the wafer 706 can be installed, cleaned, and removed without requiring the system 700 to move complex components of the cleaning apparatus such as the platter 708, the electric motor 722, the fluid tubing 728 and the electrical wiring 746.

Figure 8:
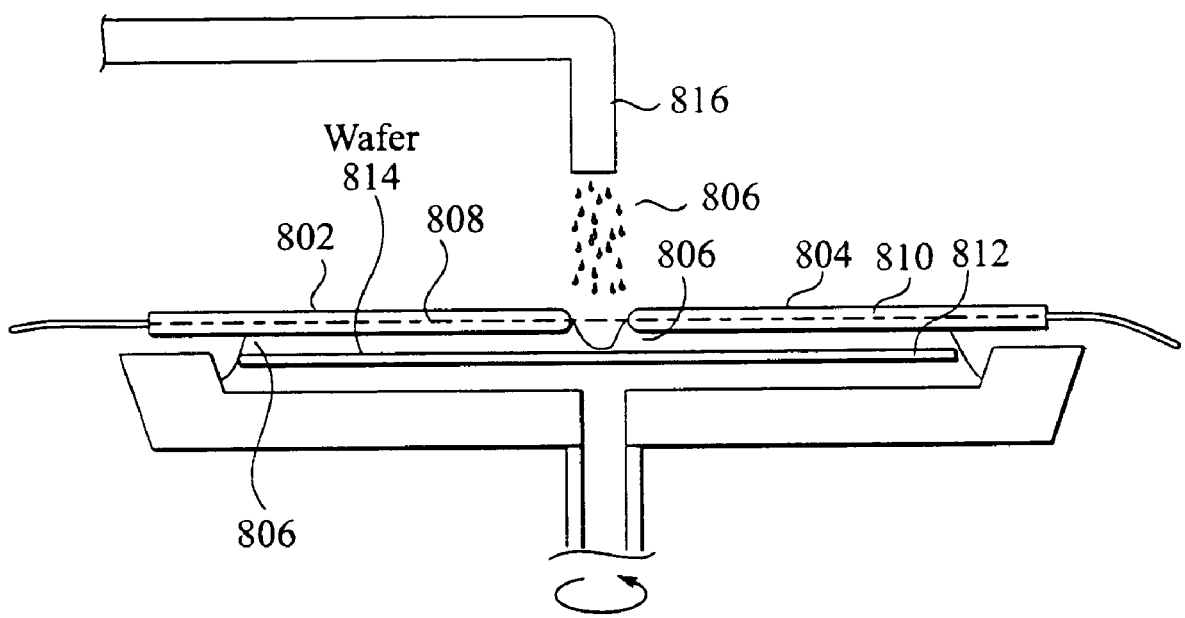
FIG. 8 is an illustration of one embodiment where a plurality of megasonic frequencies is applied to quartz rods.

FIG. 8 is an illustration of one embodiment where a plurality of megasonic frequencies are applied to quartz rods. In this embodiment, a chemical 806 is applied to the wafer 814 through a nozzle 816. A first quartz rod 802 and one or more additional rods 804 may be placed close to the wafer 814 so as to collect the liquid 806 between the quartz rods 802 and 804 and the wafer 814. The quartz rods 802 and 804 can each transfer a different frequency to the liquid couplant 806 from transducers attached at the ends of each rod (not shown). The quartz rods 802 and 804 may be placed with their axes 808 and 810 running parallel to the rotating wafer 814 to transfer sound pressure waves to the wafer top surface 812 which may be the wafer non-device side or the wafer device side.

Figure 9:
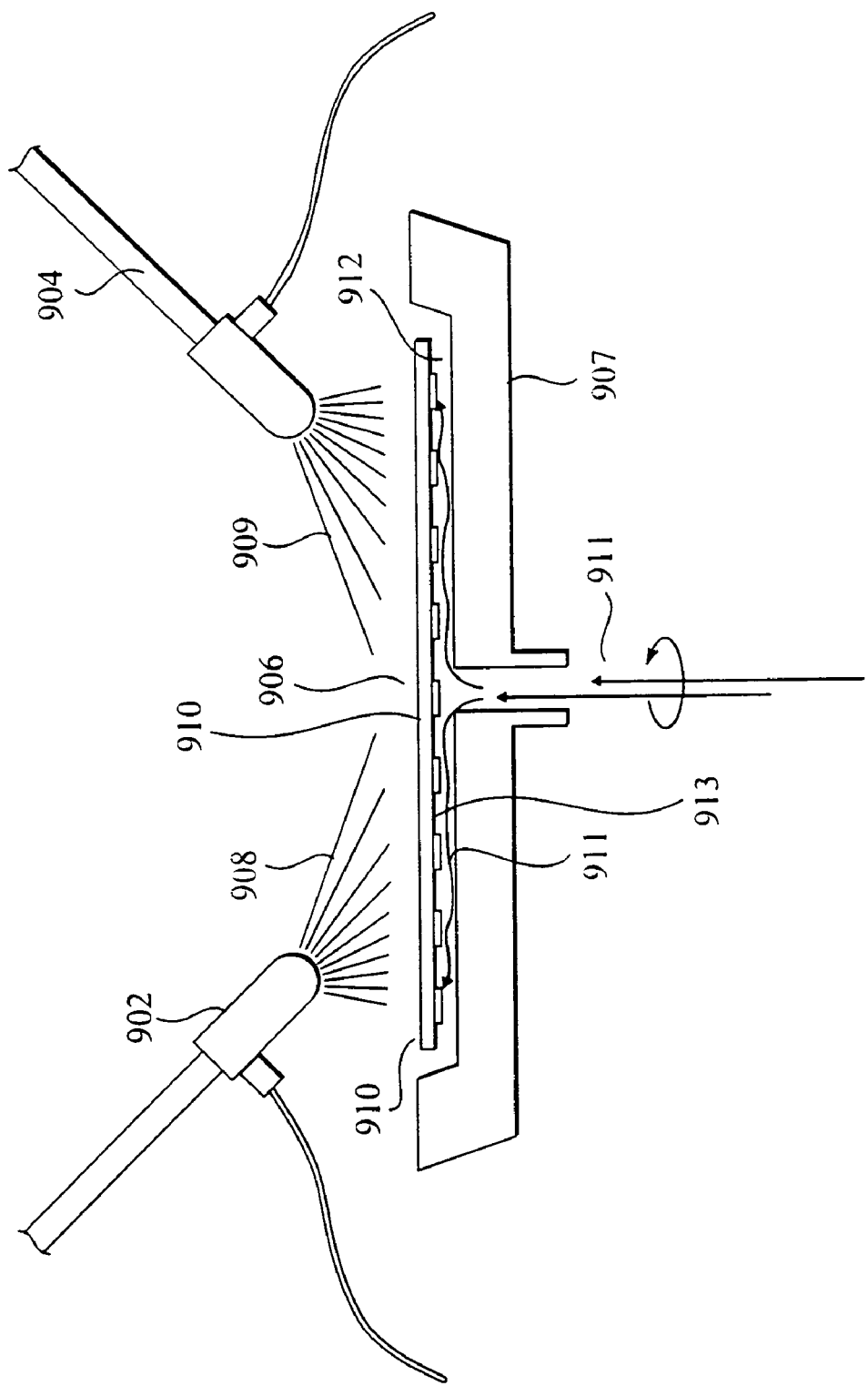
FIG. 9 is an illustration of one embodiment where a plurality of megasonic spray nozzles is used to transfer acoustic energy.

FIG. 9 is an illustration of one embodiment where a plurality of megasonic spray nozzles 902 and 904 are used to transfer acoustic energy. Each nozzle 902 and 904 imparts sonic energy to a water spray 908 and 909 that strikes a wafer 906 rotating in a platter 907. The acoustic energy is placed in water droplets 908 and 909, as imparted by the nozzles 902 and 904, and the megasonic energized water can be sprayed onto the rotating wafer non-device side surface 910. The platter 907 may have a dished out center 912 to contain cleaning chemicals 911 and in which the wafer 906 may "float". The cleaning chemicals 911 can be pumped into an area between the wafer device side 913 and the platter 907. With this embodiment, more than one megasonic spray nozzle 908 and 909 may be used in which a different frequency is imparted to one nozzle 902 than is imparted by the other nozzle 904. As a result of wafer rotation, the wafer 906 will receive both megasonic frequencies during the process. Alternatively, one or more megasonic frequencies can also by emitted from the platter 907 such that both sides of the wafer are receiving acoustic energy directly, i.e. not just the acoustic energy transmitted through the wafer to the opposite side.

Figure 10:
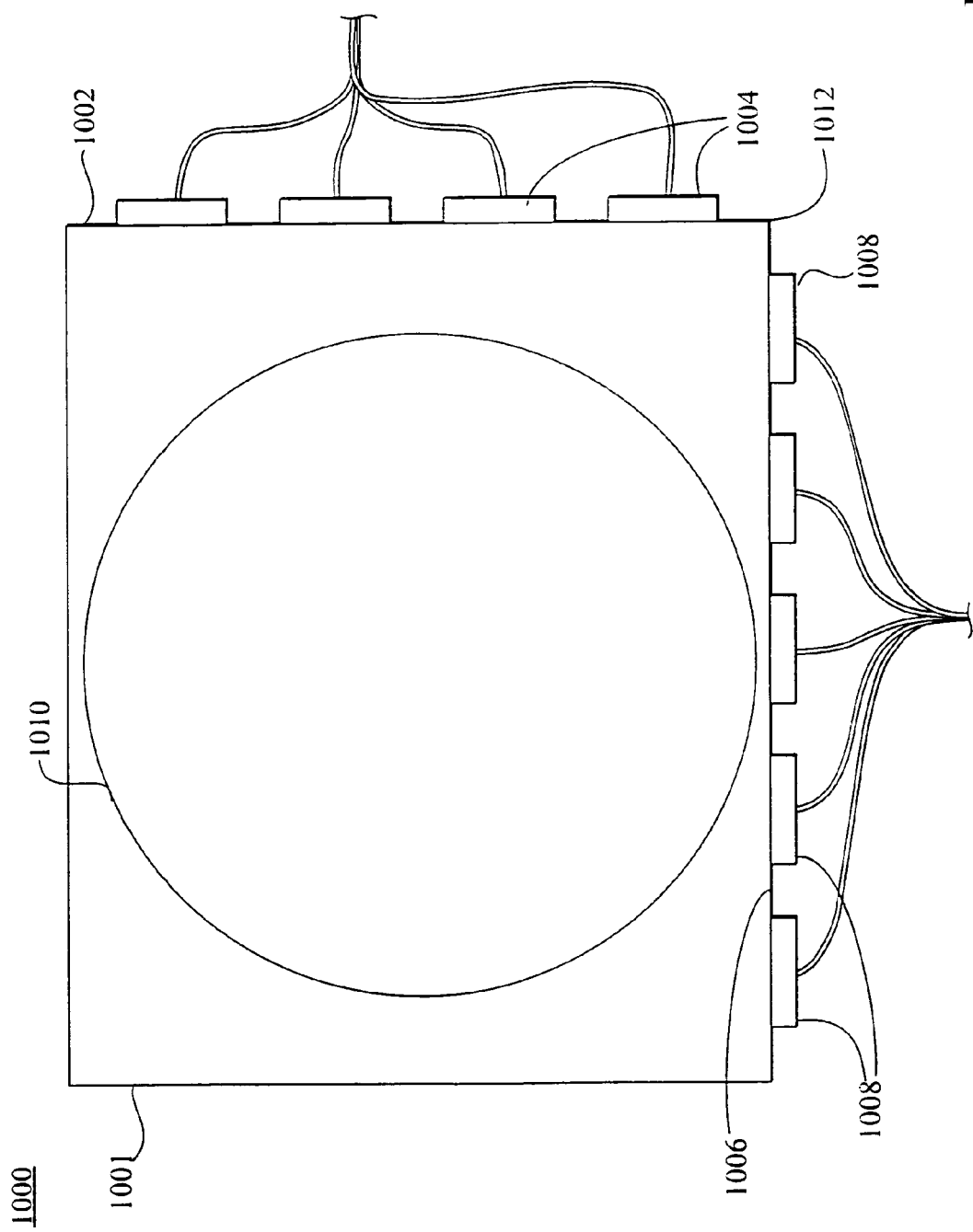
FIG. 10 is an illustration of one embodiment of an apparatus for batch processing a plurality of wafers using two or more megasonic frequencies.

FIG. 10 is an illustration of one embodiment of an apparatus for batch processing a plurality of wafers using two or more megasonic frequencies. A number of transducers 1004 and 1008 are positioned on a chamber 1001 of the cleaning apparatus 1000. Transducers of a first type 1004 generate at a first frequency while transducers of a second type 1008 generate at a second frequency. The transducers of the first type 1004 are positioned on a first chamber surface 1002 while the transducers of the second type 1008 are positioned on a second chamber surface 1006 that can be approximately perpendicular to the first surface 1002. In this manner, sound waves generated by transducers of the first type 1004 and the second type 1008 both travel parallel to a stack of wafers 1010 (only the top wafer is visible). To minimize wave interference in the process chamber 1000 from the two frequencies, neither of the transducer sets are positioned 180 degrees from the other set. In addition, one or both of the two frequencies can be pulsed. In alternate embodiments, the transducers may be at angles other than perpendicular. In one embodiment, a number of transducers, transmitting a number of frequencies, can each be positioned at angles less than 90 degrees, i.e. acute angles, to meet constraints of the megasonic cleaner housing 1012 shape and the number of frequencies to be generated. In an alternate embodiment (not shown), the transducers 1004 and 1006 can be positioned so as to be mixed on any surface.

Figure 11:
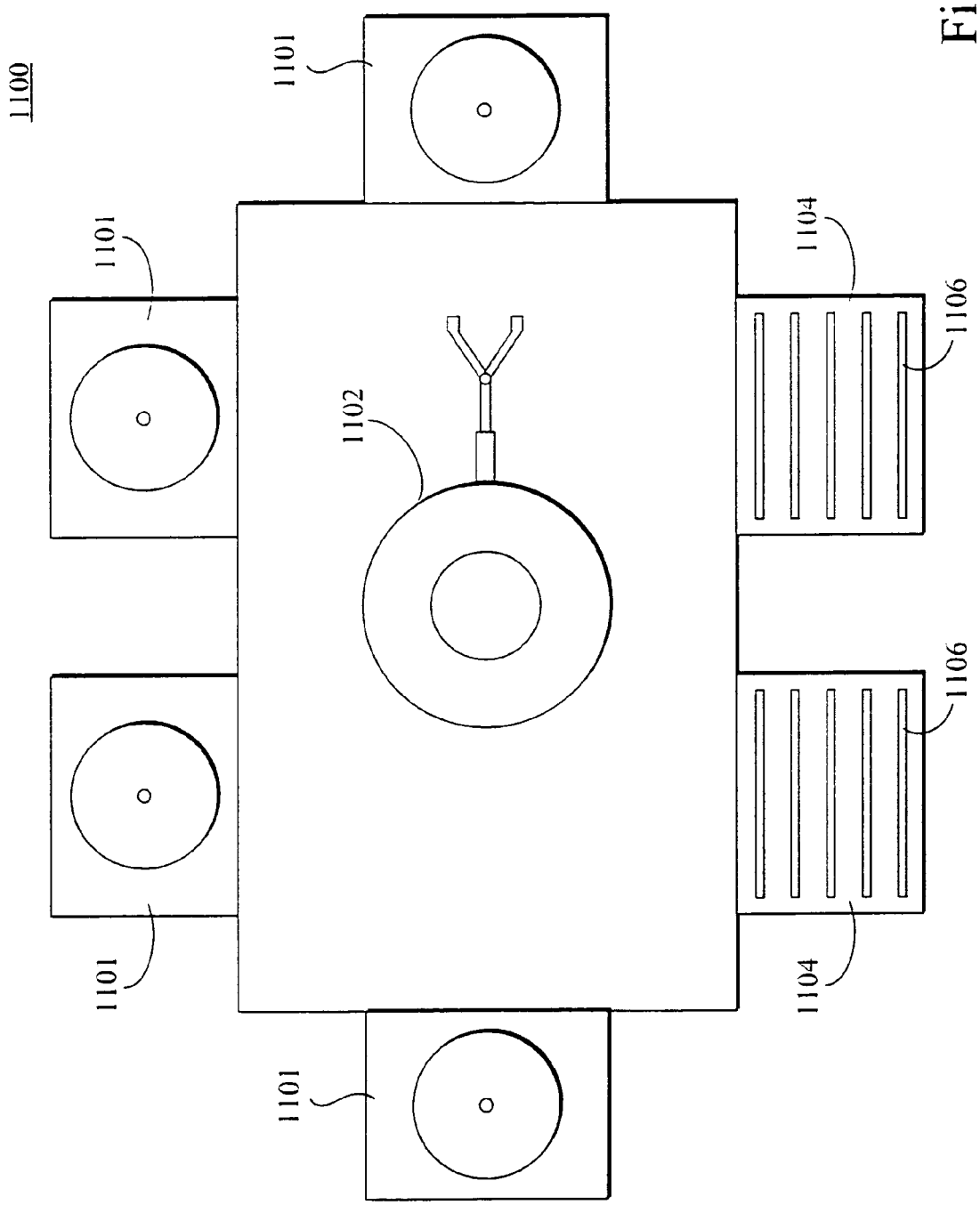
FIG. 11 is an illustration of a cluster of four single wafer cleaning apparatus that are positioned about a robot arm assembly.

FIG. 11 is an illustration of a cluster 1100 of four single wafer cleaning apparatus 1101 that are positioned about a robot arm assembly 1102. Attached at a side of the machine 1100 are a number of wafer cartridges 1104, each holding a plurality of wafers 1106 to be cleaned or that have been cleaned. The cleaning processes of the cleaning chambers 1101 proceed in a sequence timed to optimize the use of available space and the robot arm assembly 1102. One possible sequence has the robot arm assembly 1102 take an unclean wafer 1106 from a wafer cartridge 1104, install the wafer into a cleaning chamber 1101, remove a clean wafer 1106 from another process chamber 1101 and place the clean wafer 1106 into another wafer cartridge 1104. This movement from process chamber 1101 to wafer cartridge 1104 to process chamber 1101 and so on will optimize wafer 1106 cleaning times, however other sequence variations may be used to select an optimal wafer cleaning cycle time.

Figure 12:
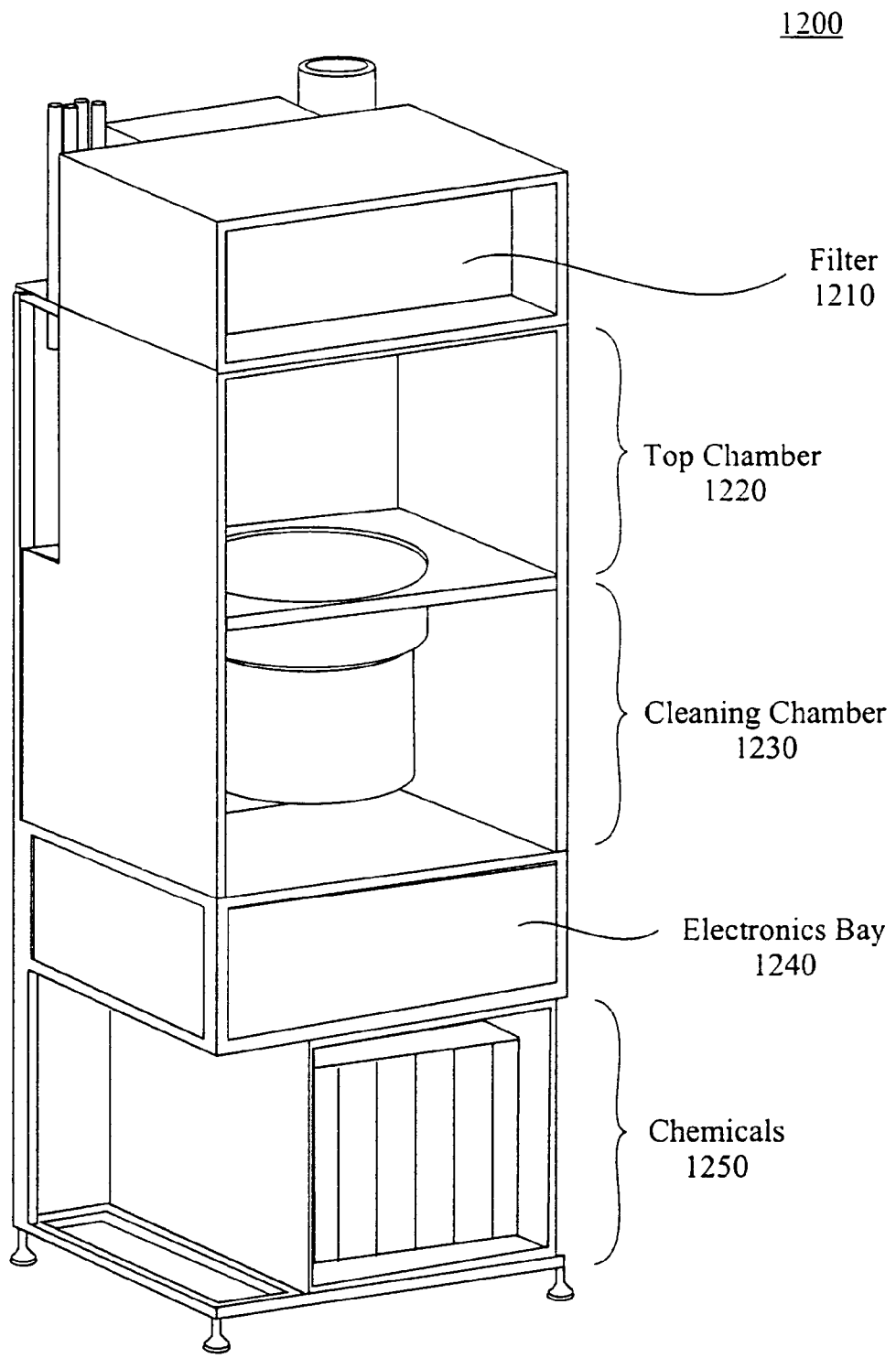
FIG. 12 is an illustration of a single wafer cleaning apparatus.

FIG. 12 is an illustration of a single wafer cleaning apparatus. The wafer cleaning apparatus 1200 is a stack of machinery. The top of the stack can be a filter 1210 where air flows through the filter 1210 using a fan or a turbine. The filter 1210 can be placed on a top chamber 1220 that positions the filter 1210 a distance from the cleaning chamber 1230 to reduce the likelihood of chemical spray reaching the filter 1210. The cleaning chamber 1230 can house the wafer holding bracket (not shown) along with the other equipment needed to processes the wafer. Beneath the cleaning chamber 1230 can be located various electronics 1240 used to control the cleaning process and at the bottom can be placed the cleaning and rinsing chemicals 1250 that feed up to the cleaning chamber.

Figure 13:
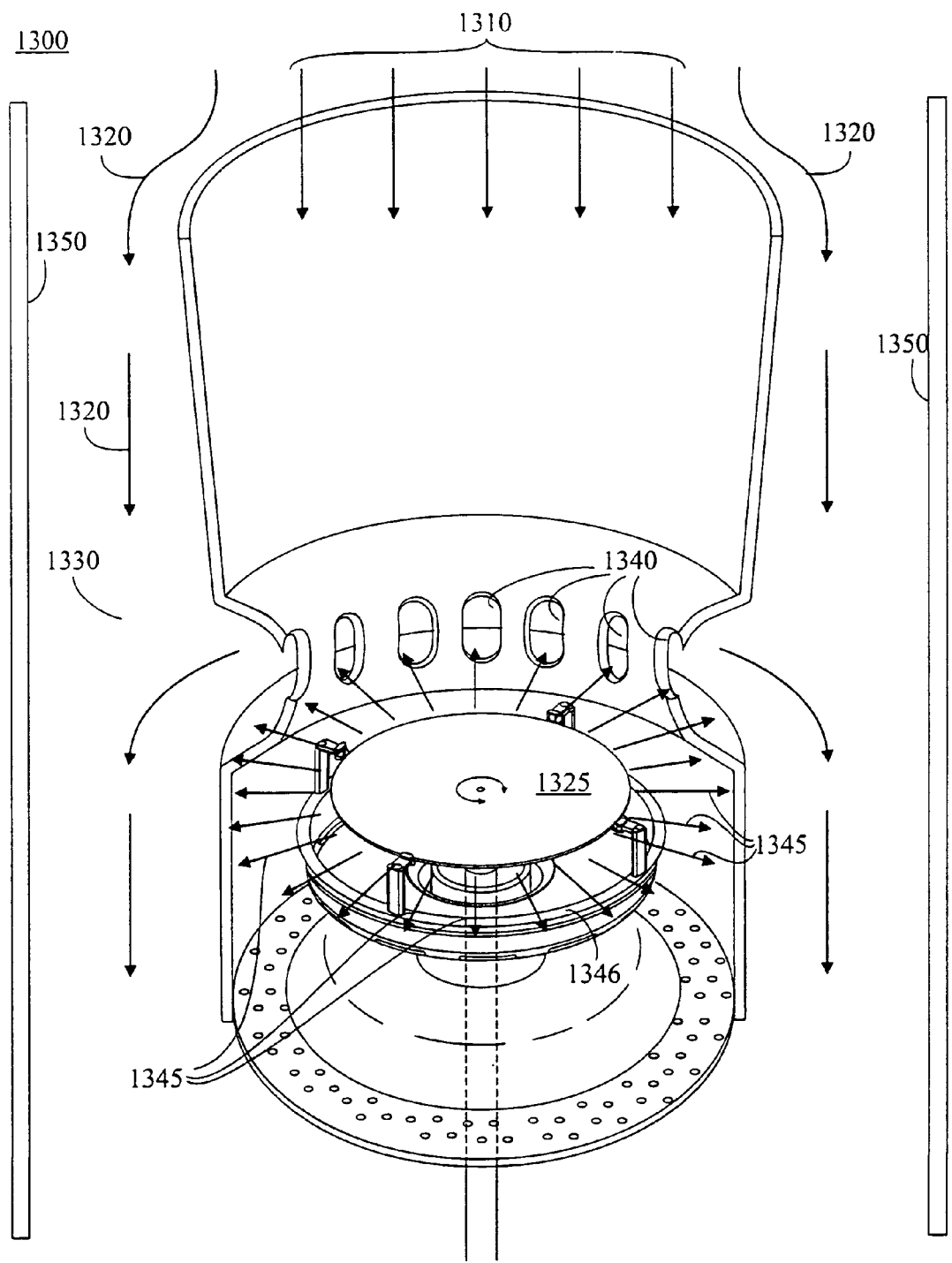
FIG. 13 is an illustration of an alternate embodiment of a top chamber.

FIG. 13 is an illustration of an alternate embodiment of a top chamber. In one embodiment, the air-flow from the filter above (not shown) is partially re-directed 1320. A portion of the air 1310 flows down onto the wafer 1325 (platter removed for clarity), however the remaining portion 1320 flows down a by-pass chamber 1330 of the top chamber 1350. A series of holes 1340 are spaced annularly and in line with the spinning wafer 1325. Chemicals 1345 that are spun off the wafer 1325 during processing are drawn into the annular holes 1340 to flow down the by-pass chamber 1330. In this manner, the overall flow through the cleaning chamber 1300 is more balanced and chemicals 1345 can be collected with less contamination. Such chemicals 1345, collected with less impurities, may be considered for reuse.

It is well known in the art that sonic energy may bounce back or reflect when changing (material) boundaries. Therefore, it is to be expected that a particular acoustic frequency generated by a transducer through the transducer adhesive, the platter body, and the platter fluoropolymer coating will have many opportunities to reflect back and interfere with later transmitted sonic energies. One approach is to design the various thickness of materials to minimize or even eliminate this reflection. Another approach is to allow bounceback, perhaps even up to an 80% reflection and then pulse the transmitted sonic energy at a rate such that the new outgoing sonic energy does not run into the reflected sonic energy. As previously mentioned, pulsing the sonic energy has the additional advantage of improving cavitation and therefore acoustic streaming.

A thickness of a 300 mm wafer is nominally 0.775 mm. The elimination or reduction in reflection can be done by choosing the thickness of the layers to be a multiple of $\lambda/2$, where $\lambda$ is the wavelength of the megasonic energy applied to the wafer. Alternatively, for pulsing, the interference by reflection can be eliminated by reducing the length of the signal pulse to less than 2 L/c with c the velocity of the acoustic signal in the layer and L the thickness of the layer. The velocity of an acoustic wave in silicon is roughly 8430 meters/second (m/s). Therefore the length of the pulse or burst should be less than $(0.775 \text{ mm})^2/(8430 \text{ m/s})=0.18$ μs. Since this burst is very short, it is a better practice to choose a frequency so that $\lambda/2=0.775$ mm and pulsing is not necessary. Since $\lambda=8430$ m/s/f with f the frequency, this gives a frequency of approximately 5.4 MHz.

After experimenting with 300 mm wafers, it was confirmed that the optimum resonance frequency for transmission through the wafer with minimum reflection is 5.4 MHz. Therefore, in one embodiment this 5.4 MHz frequency is used to transmit megasonic waves to the non-device side of the wafer. These frequency waves transmit almost without any reflection through the platter and the wafer to the wafer side not facing the platter, i.e. transparent frequency. For a different wafer thickness than the present 300 mm wafer thickness of 0.775 mm, 5.4 MHz would not be the correct frequency. To generate a transparent wave through the wafer (and the layers of preceding materials), a formula based on the following factors; the $\lambda/2$ thickness of layers ratio and the speed of sound in silicon, coupled with the wafer thickness, may be used. The general formula for calculating the frequency that will be transparent (i.e. not bounce back) is: 4215±30% m/d, where m is meters and d=the thickness of the wafer in meters. In another embodiment, however, the 4215 m/d formula for calculating frequency for the transparent wave may be used to apply the frequency to the device side of the wafer. In this manner, for a given wafer thickness, a sonic frequency having a wafer transparent to the wave could be applied directly to the wafer device side and/or the wafer non-device side. If more than one frequency is used that is transparent to the stack of materials the sound waves must pass through to arrive at the wafer surface, it could be desirable to make as many of the frequencies multiples of the lowest frequency as possible. This would allow for the transparency of such frequencies passing through the stack of materials. If one of such frequencies was transparent to the wafer, then additionally all would have such advantage. This approach for generating transparent frequencies could be used in other wafer cleaning apparatus such as apparatus that totally immerse more than one wafer or apparatus that use one or more quartz rods or apparatus that uses one or more nozzles to place sonic energy in the spray.

Particulate removal without poly-line, i.e. poly-silicon or amorphous silicon, damage to fine structures, i.e. having dimensions less than 0.3 µm, can be greatly reduced or eliminated through the use of a cleaning solution used in conjunction with megasonic energy that is applied normal to and striking the wafer backside surface. Megasonic energy in the frequency ranges of 900 kHz or higher can completely suppress damage to the fragile poly-lines even when high acoustic power is applied. 700 kHz or greater frequencies may be applied to the wafer backside that can provide a megasonic power density of between 0.01 W/cm$^2$ (Watt per centimeter squared) and 10 W/cm$^2$ and preferably between 0.1-5.0 W/cm$^2$. Effective megasonic frequencies may be in the range of 700 kHz-2.0 MHz but frequencies are preferably higher than 900 MHz and most preferably approximately 1.5 MHz±30%.

In an embodiment, the cleaning solution used (with megasonic energy), to reduce or eliminate poly-line damage, may be de-ionized water or the cleaning solution may be a mixture from the SC-1 cleaning process (mentioned above) and applied at approximately 60° C. The SC-1 cleaning process includes the cleaning mixture of $NH_4OH+H_2O_2$ added to water, and for this embodiment, the cleaning mixture could consist of an ammonia-to-hydrogen peroxide-to-water mixing ratio of approximately 1:2:80 by volume. The ammonia supplied could be an approximate 28% solution by volume with water and the hydrogen peroxide supplied in an approximate 31% solution by volume with water.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A method for positioning a substrate in a bracket, comprising:
    placing a substrate onto a rotatable substrate holding bracket comprising a plurality of air-foil shaped posts, each air-foil shaped post having a contact pad, wherein a bottom surface of the substrate is supported by the plurality of contact pads and the substrate holding bracket does not cover a top surface of the substrate;
    positioning the substrate parallel to and aligned with a platter; and
    flowing a liquid between the substrate and the platter to fill a gap between the substrate and the platter with the liquid;
    maintaining the liquid within the gap, during a low rotation speed operation of the substrate holding bracket between 10 and 1,000 rpm with surface tension and capillary forces resulting from the liquid placed between the platter and the substrate.

2. The method of claim 1, wherein a device side and a non-device side of the substrate are exposed to liquid chemicals during the low rotation speed operation.

3. The method of claim 1, further comprising maintaining the substrate position, during a high rotation speed operation of the substrate holding bracket greater than 1,000 rpm, substantially with natural forces resulting from the platter fixed in place a distance from the rotating substrate.

4. The method of claim 3, wherein the natural forces resulting from the platter fixed in place a distance from the rotating substrate are Bernoulli forces caused by the different gas flow velocities above verses below the substrate.

5. The method of claim 1, wherein maintaining the substrate position further comprises an airflow down onto the substrate from an air filter positioned above.

6. The method of claim 5, wherein the air filter is an HEPA filter.

7. The method of claim 5, wherein the air filter is an ULPA filter.

8. The method of claim 1, wherein positioning the substrate parallel to and aligned with the platter comprises positioning a bottom surface of the substrate within a dished-out area of the platter.

9. The method of claim 8, further comprising flowing the liquid between the platter and the substrate such that the bottom surface of the substrate within the dished-out area of the platter is submerged in the liquid while a top surface of the substrate remains outside of the liquid.

10. The method of claim 1, wherein the substrate is a wafer.

11. A method for positioning a substrate in a bracket, comprising:
    placing a substrate onto a rotatable substrate holding bracket having air-foil shaped posts, each air-foil shaped post having a contact pad, wherein a bottom surface of the substrate is supported by the plurality of contact pads and the substrate holding bracket does not cover a top surface of the substrate;
    positioning the substrate parallel to and aligned with a platter;
    flowing a liquid between the platter and the substrate to fill a gap between the substrate and the platter with the liquid;
    maintaining the liquid within the gap, during a first rotation speed operation of the substrate between 10 and 1,000 rpm with capillary forces resulting from the liquid placed between the platter and the substrate;
    stopping flowing of the liquid between the platter and the substrate; and
    maintaining the substrate position, during a second rotation operation of the substrate holding bracket greater than 250 rpm, substantially with Bernoulli forces resulting from the platter fixed in place a distance from the rotating substrate and different gas flow velocities above verses below the substrate.

12. The method of claim 11, wherein positioning the substrate parallel to and aligned with the platter comprises positioning a bottom surface of the substrate within a dished-out area of the platter.

13. The method of claim 12, further comprising flowing the liquid between the platter and the substrate such that the bottom surface of the substrate within the dished-out area of the platter is submerged in the liquid while a top surface of the substrate remains outside of the liquid.

14. The method of claim 13, wherein maintaining the substrate position during the first rotation speed operation further comprises an airflow down onto the substrate from an air filter positioned above.

15. The method of claim 11, wherein the substrate is a semiconductor wafer.

16. The method of claim 1, wherein the substrate is a semiconductor wafer.

* * * * *